(12) United States Patent
Choi

(10) Patent No.: US 7,417,901 B2
(45) Date of Patent: Aug. 26, 2008

(54) MEMORY DEVICE HAVING TERMINALS FOR TRANSFERRING MULTIPLE TYPES OF DATA

(75) Inventor: Joo S. Choi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/382,649

(22) Filed: May 10, 2006

(65) Prior Publication Data

US 2006/0198230 A1  Sep. 7, 2006

Related U.S. Application Data

(62) Division of application No. 10/782,717, filed on Feb. 19, 2004, now Pat. No. 7,116,600.

(51) Int. Cl.
*G11C 7/10* (2006.01)
(52) U.S. Cl. .................. 365/189.03; 365/189.17; 365/191; 365/198
(58) Field of Classification Search ............ 365/185.09, 365/191, 193, 194, 198, 189.03, 189.17; 708/531; 714/6, 758, 763, 800, 801, 802, 714/803, 804, 805
See application file for complete search history.

(56) References Cited

U.S. PATENT DOCUMENTS

| | | |
|---|---|---|
| 4,566,102 A | 1/1986 | Hefner |
| 4,794,597 A | 12/1988 | Ooba et al. |
| 4,888,773 A | 12/1989 | Arlington et al. |
| 5,058,115 A | 10/1991 | Blake et al. |
| 5,173,905 A | 12/1992 | Parkinson et al. |
| 5,228,046 A | 7/1993 | Blake et al. |
| 5,233,614 A | 8/1993 | Singh |
| 5,533,036 A | 7/1996 | Blake et al. |
| 5,682,394 A | 10/1997 | Blake et al. |
| 5,729,497 A | 3/1998 | Pawlowski |
| 5,771,346 A | 6/1998 | Norman et al. |
| 5,864,569 A | 1/1999 | Roohparvar |
| 6,009,548 A | 12/1999 | Chen et al. |
| 6,018,817 A | 1/2000 | Chen et al. |
| 6,044,479 A | 3/2000 | Dell |
| 6,044,483 A | 3/2000 | Chen et al. |
| 6,112,314 A | 8/2000 | Norman et al. |

(Continued)

OTHER PUBLICATIONS

"U.S. Appl. No. 11/382,641 Non-Final Office Action mailed Nov. 16, 2006", (Nov. 16, 2006), 14 pages.

(Continued)

*Primary Examiner*—Richard T. Elms
*Assistant Examiner*—Alexander Sofocleous
(74) *Attorney, Agent, or Firm*—Schwegman, Lundberg & Woessner, P.A.

(57) ABSTRACT

A memory device includes a number of terminals for transferring input data and output data to and from a memory array. The memory device includes an auxiliary circuit for receiving input auxiliary information associated with the input data and for generating output auxiliary information associated with the output data. The input and output auxiliary information include inverting codes, parity codes, temperature information or time delay information. The input and output auxiliary information are transferred to and from the memory device on the same terminals that the input data and the output data are transferred.

28 Claims, 21 Drawing Sheets

U.S. PATENT DOCUMENTS

| | | | |
|---|---|---|---|
| 6,141,789 A | 10/2000 | Cypher | |
| 6,178,537 B1 | 1/2001 | Roohparvar | |
| 6,233,716 B1 | 5/2001 | Cypher | |
| 6,282,686 B1 | 8/2001 | Cypher | |
| 6,286,077 B1 | 9/2001 | Choi et al. | |
| 6,301,680 B1 | 10/2001 | Cypher | |
| 6,304,992 B1 | 10/2001 | Cypher | |
| 6,393,597 B1 | 5/2002 | Cypher | |
| 6,453,440 B1 | 9/2002 | Cypher | |
| 6,473,880 B1 | 10/2002 | Cypher | |
| 6,477,682 B2 | 11/2002 | Cypher | |
| 6,519,717 B1 | 2/2003 | Williams et al. | |
| 6,567,938 B2 * | 5/2003 | Wan | 714/701 |
| 6,574,768 B2 | 6/2003 | Cypher | |
| 6,584,595 B2 | 6/2003 | Cypher | |
| 6,601,191 B1 | 7/2003 | Norman et al. | |
| 6,717,879 B2 | 4/2004 | Tanaka | |
| 6,823,476 B2 | 11/2004 | Williams et al. | |
| 6,838,331 B2 | 1/2005 | Klein | |
| 6,839,875 B2 | 1/2005 | Roohparvar | |
| 6,848,070 B1 * | 1/2005 | Kumar | 714/758 |
| 6,853,595 B2 | 2/2005 | Sawamura et al. | |
| 6,961,269 B2 | 11/2005 | Royer | |
| 7,015,826 B1 * | 3/2006 | Chan et al. | 340/870.17 |
| 7,075,851 B2 | 7/2006 | Tanaka | |
| 7,116,600 B2 | 10/2006 | Choi | |
| 7,274,604 B2 | 9/2007 | Choi | |
| 2002/0013929 A1 | 1/2002 | Maciver | |
| 2002/0188909 A1 | 12/2002 | Chen | |
| 2004/0163027 A1 | 8/2004 | MacLaren et al. | |
| 2004/0163028 A1 | 8/2004 | Olarig | |
| 2004/0168101 A1 | 8/2004 | Kubo | |
| 2005/0028056 A1 | 2/2005 | Tsao et al. | |
| 2005/0028057 A1 | 2/2005 | Briggs | |
| 2005/0111266 A1 | 5/2005 | Rover | |
| 2005/0165999 A1 | 7/2005 | Choi et al. | |
| 2005/0185442 A1 | 8/2005 | Choi | |
| 2005/0190635 A1 | 9/2005 | Hargan | |
| 2005/0289441 A1 * | 12/2005 | Kawagoe et al. | 714/763 |
| 2006/0198229 A1 | 9/2006 | Choi | |
| 2006/0242495 A1 | 10/2006 | Choi | |
| 2007/0055792 A1 | 3/2007 | Choi | |
| 2007/0055796 A1 | 3/2007 | Choi | |

OTHER PUBLICATIONS

"U.S. Appl. No. 11/382,641 Notice of Allowance mailed May 17, 2007", (May 17, 2007), 8 pages.

"U.S. Appl. No. 11/382,641 Response filed mailed Mar. 16, 2007 to Non-Final Office Action mailed Nov. 16 2006", (Mar. 16, 2007), 17 pages.

"U.S. Appl. No. 111/456,058 Response filed mailed Sep. 28, 2007 to Non-Final Office Action mailed Jun. 28 2007", (Sep. 28, 2007), 12 pages.

"Notice of Allowance and Fee(S) Due mailed Sep. 06, 2007 in U.S. Appl. No. 11/590,364, 7 pgs.", 7 pages.

* cited by examiner

| | $DO_P$ | 80 80 80 80 80 80 80 80 | Io | X | Y |
|---|---|---|---|---|---|
| | | 00000111 | Io | X | Y |
| ROW 1 { Dout-0 TO Dout-7 | | 11111000 | 1 | 8 | |
| INVERTED (Dout-0 TO Dout-7) | | 00000111 | | | 0 |
| | | 11110000 | 1 | 7 | |
| | | 00001111 | | | 1 |
| | | 11100000 | 1 | 6 | |
| | | 00011111 | | | 2 |
| | | 11000000 | 1 | 5 | |
| | | 00111111 | | | 3 |
| | | 10000000 | 0 | 4 | |
| | | 01111111 | | | 4 |
| ROW 6 { Dout-0 TO Dout-7 | | 00000000 | 0 | 3 | |
| INVERTED (Dout-0 TO Dout-7) | | 11111111 | | | 5 |
| | | 00000001 | 0 | 2 | |
| | | 11111110 | | | 6 |
| | | 00000011 | 0 | 1 | |
| | | 11111100 | | | 7 |
| | | 00000111 | 0 | 0 | |
| | | 11111000 | | | 8 |
| | | 00001111 | 0 | 1 | |
| | | 11110000 | | | 7 |
| | | 00011111 | 0 | 2 | |
| | | 11100000 | | | 6 |
| | | 00111111 | 0 | 3 | |
| | | 11000000 | | | 5 |
| | | 01111111 | 0 | 4 | |
| | | 10000000 | | | 4 |
| | | 11111111 | 1 | 5 | |
| | | 00000000 | | | 3 |
| | | 11111110 | 1 | 6 | |
| | | 00000001 | | | 2 |
| ROW 16 { Dout-0 TO Dout-7 | | 11111100 | 1 | 7 | |
| INVERTED (Dout-0 TO Dout-7) | | 00000011 | | | 1 |

FIG. 6

|  | Dout-0 TO Dout-7<br>80 80 80 80 80 80 80 80 | PO |
|---|---|---|
| ROW 1 | 00000000 | 0 |
|  | 00000001 | 1 |
| ROW 3 | 00000011 | 0 |
|  | 00000111 | 1 |
|  | 00001111 | 0 |
| ROW 6 | 00011111 | 1 |
|  | 00111111 | 0 |
|  | 01111111 | 1 |
|  | 11111111 | 0 |
|  | 11111110 | 1 |
|  | 11111100 | 0 |
|  | 11111000 | 1 |
|  | 11110000 | 0 |
| ROW 14 | 11100000 | 1 |
|  | 11000000 | 0 |
|  | 10000000 | 1 |

FIG. 9

| BITS | COL1 TMP | COL2 TMP | COL3 TMP | COL4 TMP | COL5 TMP | COL6 TMP | COL7 TMP | COL8 TMP |
|---|---|---|---|---|---|---|---|---|
| TE-0 | 0 | 0 | 0 | 0 | 0 | 0 | 0 | 0 |
| TE-1 | 0 | 0 | 0 | 0 | 0 | 0 | 0 | 1 |
| TE-2 | 0 | 0 | 0 | 0 | 0 | 0 | 1 | 1 |
| TE-3 | 0 | 0 | 0 | 0 | 0 | 1 | 1 | 1 |
| TE-4 | 0 | 0 | 0 | 0 | 1 | 1 | 1 | 1 |
| TE-5 | 0 | 0 | 0 | 1 | 1 | 1 | 1 | 1 |
| TE-6 | 0 | 0 | 1 | 1 | 1 | 1 | 1 | 1 |
| TE-7 | 0 | 1 | 1 | 1 | 1 | 1 | 1 | 1 |
| TEMP °C | 0 | 15 | 30 | 45 | 60 | 75 | 90 | 105 |

FIG. 12

| BITS | COL1 CAL | COL2 CAL | COL3 CAL | COL4 CAL | COL5 CAL | COL6 CAL | COL7 CAL | COL8 CAL |
|---|---|---|---|---|---|---|---|---|
| CA-0 | 0 | 0 | 0 | 0 | 0 | 0 | 0 | 0 |
| CA-1 | 0 | 0 | 0 | 0 | 0 | 0 | 0 | 1 |
| CA-2 | 0 | 0 | 0 | 0 | 0 | 0 | 1 | 1 |
| CA-3 | 0 | 0 | 0 | 0 | 0 | 1 | 1 | 1 |
| CA-4 | 0 | 0 | 0 | 0 | 1 | 1 | 1 | 1 |
| CA-5 | 0 | 0 | 0 | 1 | 1 | 1 | 1 | 1 |
| CA-6 | 0 | 0 | 1 | 1 | 1 | 1 | 1 | 1 |
| CA-7 | 0 | 1 | 1 | 1 | 1 | 1 | 1 | 1 |
| DELAY | -200 | -150 | -100 | -50 | 50 | 100 | 150 | 200 |

FIG. 19

MEMORY DEVICE HAVING TERMINALS FOR TRANSFERRING MULTIPLE TYPES OF DATA

RELATED APPLICATION

This application is a Divisional of U.S. application Ser. No. 10/782,717, filed Feb. 19, 2004, now U.S. Pat. No. 7,116,600, which is incorporated herein by reference.

FIELD

Embodiments of the present invention relate generally to semiconductor devices, more particularly, to transfer of data in memory devices.

BACKGROUND

Semiconductors devices such as memory devices reside in many computer and electronic products. Memory devices store data. Input data is stored into a memory device in a write operation. Output data is outputted from the memory device in a read operation.

Most memory devices have data terminals or data pins (input/output pins) for transferring the input and output data. Some memory devices provide codes such as error correction codes so that the input or output data can be verified.

The codes are usually transferred on code terminals different from the data terminals. The code terminals occupy space in the memory device, thereby reducing available space of the memory device for other purposes.

BRIEF DESCRIPTION OF THE DRAWINGS

FIG. 6 shows exemplary data with inversion information according to an embodiment of the invention.

FIG. 9 shows exemplary data with parity information according to an embodiment of the invention.

FIG. 12 shows exemplary temperature information according to an embodiment of the invention.

FIG. 19 shows an exemplary calibrating timing information according to an embodiment of the invention.

DETAILED DESCRIPTION OF THE DRAWINGS

Figure 1:
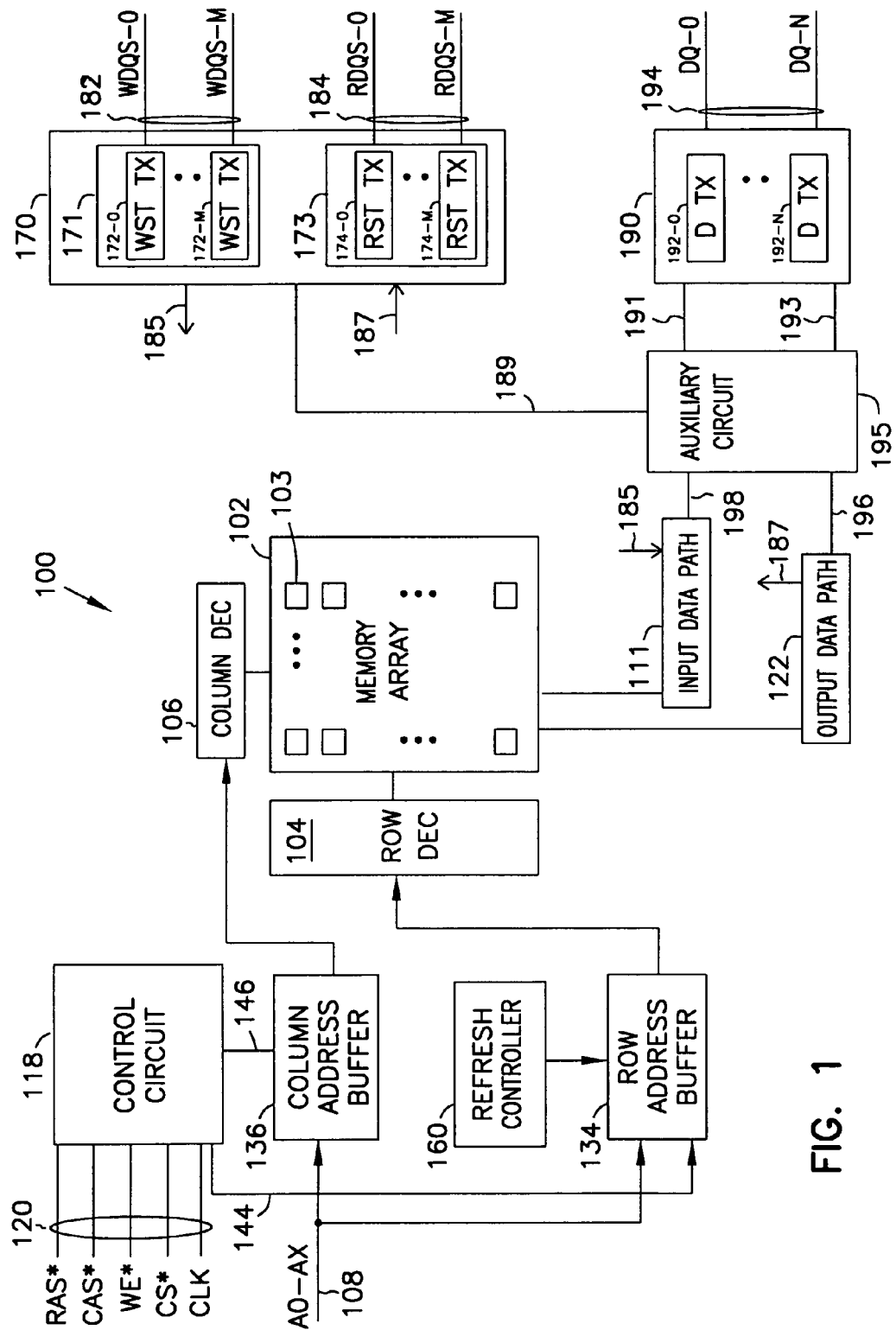
FIG. 1 shows a memory device according to an embodiment of the invention.

The following description and the drawings illustrate specific embodiments of the invention sufficiently to enable those skilled in the art to practice the embodiments of the invention. Other embodiments may incorporate structural, logical, electrical, process, and other changes. In the drawings, like numerals describe substantially similar components throughout the several views. Examples merely typify possible variations. Portions and features of some embodiments may be included in or substituted for those of others. The scope of the invention encompasses the full ambit of the claims and all available equivalents.

FIG. 1 shows memory device according to an embodiment of the invention. Memory device 100 includes a memory array 102 having a plurality of memory cells 103 arranged in rows and columns.

Row decode 104 and column decode 106 access memory cells 103 in response to address signals A0 through AX (A0-AX), provided on address lines 108.

A row address buffer 134 transfers row addresses on lines 108 to row decoder 104 based on a signal on line 144. A column address buffer 136 transfers column addresses on lines 108 to column decoder 106 based on a signal on line 146.

A control circuit 118 controls the operations of memory device 100 based on control signals on control lines 120. Examples of the control signals on lines 120 include a Row Access Strobe signal RAS*, a Column Access Strobe CAS* signal, a Write Enable signal WE*, a Chip Select signal CS*, and a Clock signal CLK. Examples of the operations of memory device 100 include a read operation, a write operation, and a refresh operation.

A refresh controller 160 controls the refresh operation of memory device 100 to refresh the content of memory cells 103. The write operation writes input data from data lines 194 to memory cells 103. The read operation reads output data from memory cells 103 to data lines 194. Data lines 194 are bi-directional data lines; these lines carry both the input data provided to memory device 100 by an external source and the output data outputted from memory device 100. A combination of the address signals A0-AX on lines 108 provides the address of a row or a column of memory cells 103 being read or written.

Memory device 100 further includes an input data path 111, an output data path 122, a strobe transceiver circuit 170, and a data transceiver circuit 190. Data transceiver circuit 190 transfers data between data lines 194 and memory array 102. Strobe transceiver circuit 170 transfers timing information of the data.

Strobe transceiver circuit 170 includes a write strobe unit 171 having write strobe transceivers (WST TX) 172 (172-0 to 172-M), and read strobe unit 173 having read strobe transceivers (RST TX) 174 (174-0 to 174-M). Write strobe unit 171 transfers timing information of the input data. The write strobe signals WDQS (0-M) on lines 182 represent the timing information of the input data. Read strobe unit 173 transfers timing information of output data. The read strobe signals RDQS (0-M) signals on lines 184 represent the timing information of the output data.

Data transceiver circuit 190 includes data transceivers (D TX) 192 (192-0 to 192-N). Data transceivers 192 are bi-directional circuits; they transfer data in both directions. Data transceivers 192 transfer both of the input data and the output data. The data (data signals or data bits) DQ (0-N) on data lines 194 represent both the input data and the output data. DQ (0-N) represent the input data when memory device 100 receives data during the write operation. DQ (0-N) represent the output data when memory device 100 outputs data during the read operation.

Input data path 111 transfers data between data transceiver circuit 190 and memory array 102 during the write operation. Output data path 122 transfers data between data transceiver circuit 190 and memory array 102 during the read operation.

Memory device 100 further includes an auxiliary circuit 195 for performing various functions to the input and output data and for transferring auxiliary information to and from memory device 100 via data lines 194. Examples of the auxiliary information include inverting codes, parity codes, temperature codes, or timing calibrating codes, or any combination of these codes.

The inverting codes carry information associated with the inversion of the input data, or the output data, or both. The parity codes carry parity information of input data, or the output data, or both. The temperature codes carry temperature information of memory device 100. The timing calibrating codes carry calibrating timing information to calibrate or adjust a timing of the output data.

In memory device 100, the input and output data (DQ-0 through DQ-N) constitute a first type of data, which are the data written to and read from memory array 102. The auxiliary information or the auxiliary codes constitute a second type of data, which are different from the data written to or read from memory array 102.

FIG. 1 includes a number of lines such as lines 185, 187, 189, 191, 193, 196 and 198. Each of these lines may include a bus of multiple separate conductors. For clarity, FIG. 1 represents a bus 185, 187, 189, 191, 193, 196 or 198 as a single line.

Data lines 194 correspond to external terminals or external connections of memory device 100. In some embodiments, data lines 194 correspond to pins or solder balls on a packaged integrated circuit of memory device 100. In other embodiments, data lines 194 correspond to pads on a circuit die of memory device 100.

Memory device 100 may be a dynamic random access memory (DRAM) device, a static random access memory (SRAM) device, or a flash memory device. Examples of DRAM devices include synchronous DRAM commonly referred to as SDRAM, SDRAM II, SGRAM (Synchronous Graphics Random Access Memory), DDR SDRAM (Double Data Rate SDRAM), DDR II SDRAM, DDR III SDRAM, GDDR III SDRAM (Graphic Double Data Rate), GDDR IV SDRAM, and Rambus DRAM devices. In FIG. 1, some elements of memory device 100 are omitted for clarity.

Figure 2:
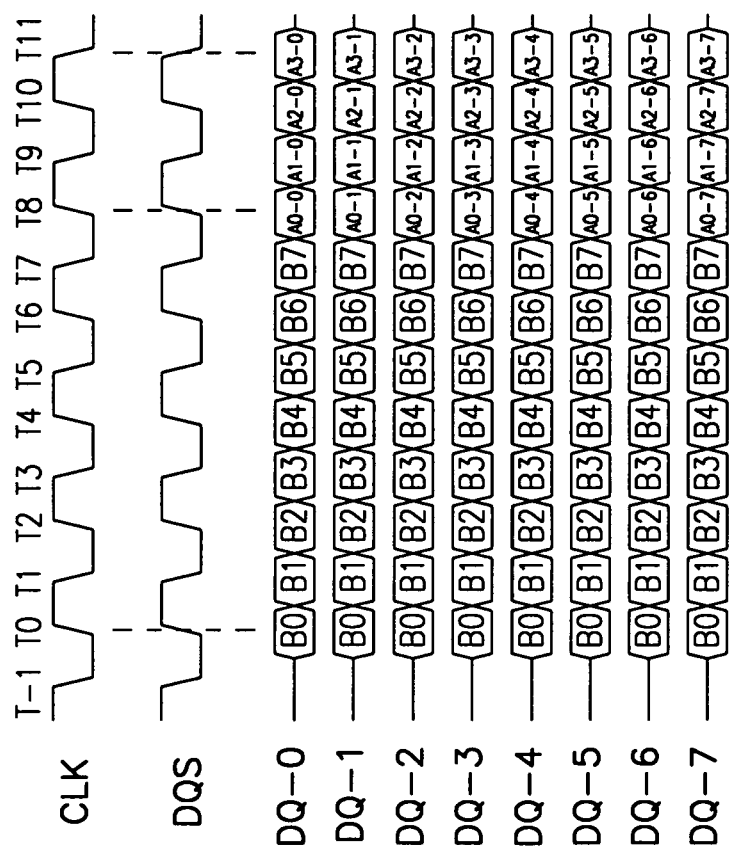
FIG. 2 is an exemplary timing diagram for the memory device of FIG. 1.

FIG. 2 is an exemplary timing diagram for the memory device of FIG. 1. In FIG. 2, T-1 through T11 represent various times. CLK is the CLK signal on lines 120 of FIG. 1. DQS represents either one of the RDQS (0-M) signals or one of the WDQS (0-M) signals of FIG. 1. DQ-0 through DQ-7 represent either the input data or the output data on data lines 194. Each of the DQ-0 through DQ-N has a number of bits or data bits B0 through B7. FIG. 2 shows eight bits (B0-B7) for each of the DQ-0 through DQ-7 as an example. In other embodiments, each of the DQ-0 through DQ-7 may have other number of bits, for example, 16, 32, 64 or other numbers.

Between times T0-T7, data bits B0-B7 of each of the DQ-0 through DQ-N are transferred to data lines 194. For example, at time T0 a group of data bits B0 of all DQ-0 through DQ-N are transferred; at time T1 a group of data bits B1 of all DQ-0 through DQ-N are transferred; and at time T7, a group of data bits B7 of all DQ-0 through DQ-N are transferred. Thus, eight (8) groups of data bits are transferred between times T0-T7. In FIG. 2, eight groups of data bits are transferred because there are eight bits in each of the DQ-0 through DQ-N. The number of groups of data bits, however, may be any number, for example, 16, 32, 64 or other numbers.

FIG. 2 also shows a number of groups of auxiliary bits: a first group (A0) of auxiliary bits A0-0 through A0-7, a second group (A1) of auxiliary bits A1-0 through A1-7, a third group (A2) of auxiliary bits A2-0 through A2-7, and a fourth group (A3) of auxiliary bits A3-0 through A3-7. FIG. 2 shows four groups of auxiliary bits as an example. In other embodiments, the number of groups of auxiliary bits may be less than or greater than four. Each group of auxiliary bits carries a particular auxiliary information. As described previously in FIG. 1, examples of the auxiliary information include inverting codes, parity codes, temperature codes, or timing calibrating codes, or any combination of these codes.

All auxiliary bits are transferred to the same data lines 194 that the data bits B0 through B7 are transferred. A0-0 through A0-7 are transferred to data lines 194 at time T8. A1-0 through A1-7 are transferred to data lines 194 at time T9. A2-0 through A2-7 are transferred to data lines 194 at time T10. A3-0 through A3-7 are transferred to data lines 194 at time T11. Transferring the auxiliary information or auxiliary bits on the same data lines 194 that the data bits are transferred eliminate the need for additional lines (terminals) to transfer the auxiliary bits, thereby saving space in memory device 100. In FIG. 2, the bits within one group of auxiliary bits are transferred to data lines 194 in parallel such that each bit is transferred on a separate line. For example, at time T8, bit A0-0 is transferred on the line corresponding to DQ-0 and bit A0-1 is transferred on the line corresponding to DQ-1. In some embodiments, the bits within one group of auxiliary bits may be transferred to data lines 194 in series such that all bits within one group of auxiliary bits are transferred on the same line. For example, bits A0-0 through A0-7 may be transferred on the same line such as the line corresponding to DQ-0.

Each auxiliary bit within a group of auxiliary bits carries auxiliary information of one of the groups of data bits. Thus, one group of auxiliary bits carries a specific auxiliary information of all groups of data bits.

For example, if the group of auxiliary bits A0-0 through A0-7 carries inverting codes, then bit A0-0 carries the inverting code for the group of data bits B0 (bits B0 of all DQ-0 through DQ-N), bit A0-1 carries the inverting code for the group of data bits B1 (bits B1 of all DQ-0 through DQ-N), and bit A0-7 carries the inverting code for the group of data bits B7 (bits B7 of all DQ-0 through DQ-N). Based on the values of each of the bits A0-0 through A0-7, memory device 100 decides whether to invert the data bits B0 through B7 of DQ-0 through DQ-7. In some cases, power is saved by transferring an inverted version of the data bits instead of transferring the original version of the data bits.

As another example, if the group of auxiliary bits A1-0 through A1-7 carries parity codes, then bit A1-0 carries the parity code for the group of data bits B0, bit A1-1 carries the parity code for the group of data bits B1, and bit A1-7 carries the parity code for the group of data bits B7. The parity codes allows the data bits B0 through B7 of DQ-0 through DQ-7 bits groups of data bits to be verified for validity.

The combination of all auxiliary bits in one auxiliary group carries auxiliary information such as temperature codes and timing calibrating codes. In the example of FIG. 2, since there are eight bits in each group of auxiliary bits, there are 256 ($2^8$=256) different combinations in each group of auxiliary bits. Thus, each group of auxiliary bits may be used to represent one of the 256 different auxiliary information such as the temperature codes or the timing calibrating codes. For example, a combination of the auxiliary bits A2-0 through A2-7 may represent a particular temperature code. As another example, a combination of the bits A3-0 through A3-7 may represent a particular timing calibrating code.

In FIG. 2, the groups of auxiliary bits are transferred at time T8, after the groups of data bits are transferred between times T0-T7. In other embodiments, at least one group of auxiliary bits is transferred before the groups of data bits are transferred. For example, at least one of the A0 through A4 groups of auxiliary bits may be transferred at time T-1, before time T0.

In FIG. 2, one group of auxiliary bits (e.g., group A0 or A1) carries the inverting codes or the parity codes for all of the groups of data bits. In some embodiments, more than one group of auxiliary bits are used to carry one particular auxiliary information. For example, more than one group of auxiliary bits may be used to carry the inverting codes or the parity codes for all of the groups of data bits.

Figure 3:
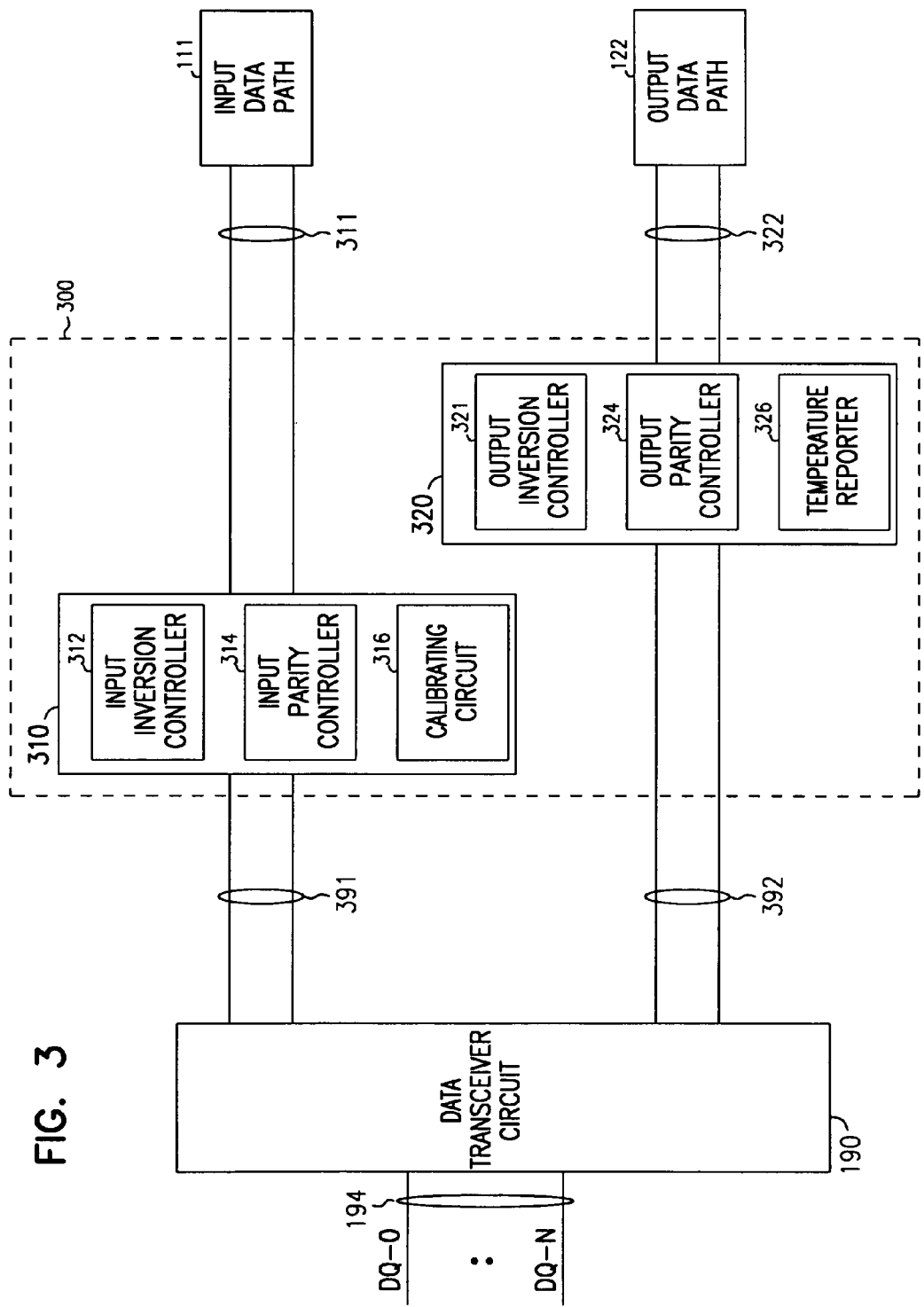
FIG. 3 is a circuit diagram of an auxiliary circuit according to an embodiment of the invention.

FIG. 3 is a circuit diagram of an auxiliary circuit according to an embodiment of the invention. Auxiliary circuit 300 may be used as auxiliary circuit 195 of memory device 100 of FIG. 1. In FIG. 3, auxiliary circuit 300 includes an input auxiliary controller 310 and an output auxiliary controller 320. Input auxiliary controller 310 controls auxiliary information transferred between data lines 194 and input data path 111. Output auxiliary controller 320 controls auxiliary information between data lines 194 and output data path 122.

Input auxiliary controller 310 includes an input inversion controller 312 for inverting input data bits based on input inverting codes associated with input data. An input parity controller 314 verifies the validity of the input data bits based on input parity codes. A calibrating circuit 316 enables the memory device to adjust the timing of a transfer of data on data lines 194 based on timing calibrating codes. The input inverting codes, the input parity codes, and the timing calibrating codes are received from data lines 194. In some embodiments, input auxiliary controller 310 includes only one or two of the circuits 312, 314, and 316.

Output auxiliary controller 320 includes an output inversion controller 321 for inverting output data bits based on output inverting codes generated by output inversion controller 321. An output parity controller 324 generates output parity codes for the output data bits. A temperature reporting circuit 326 provides temperature codes indicating the temperature of the memory device. The output inverting codes, the output parity codes, and the temperature codes are transferred to data lines 194. In some embodiments, output auxiliary controller 320 includes only one or two of the circuits 321, 324, and 326.

Figure 4:
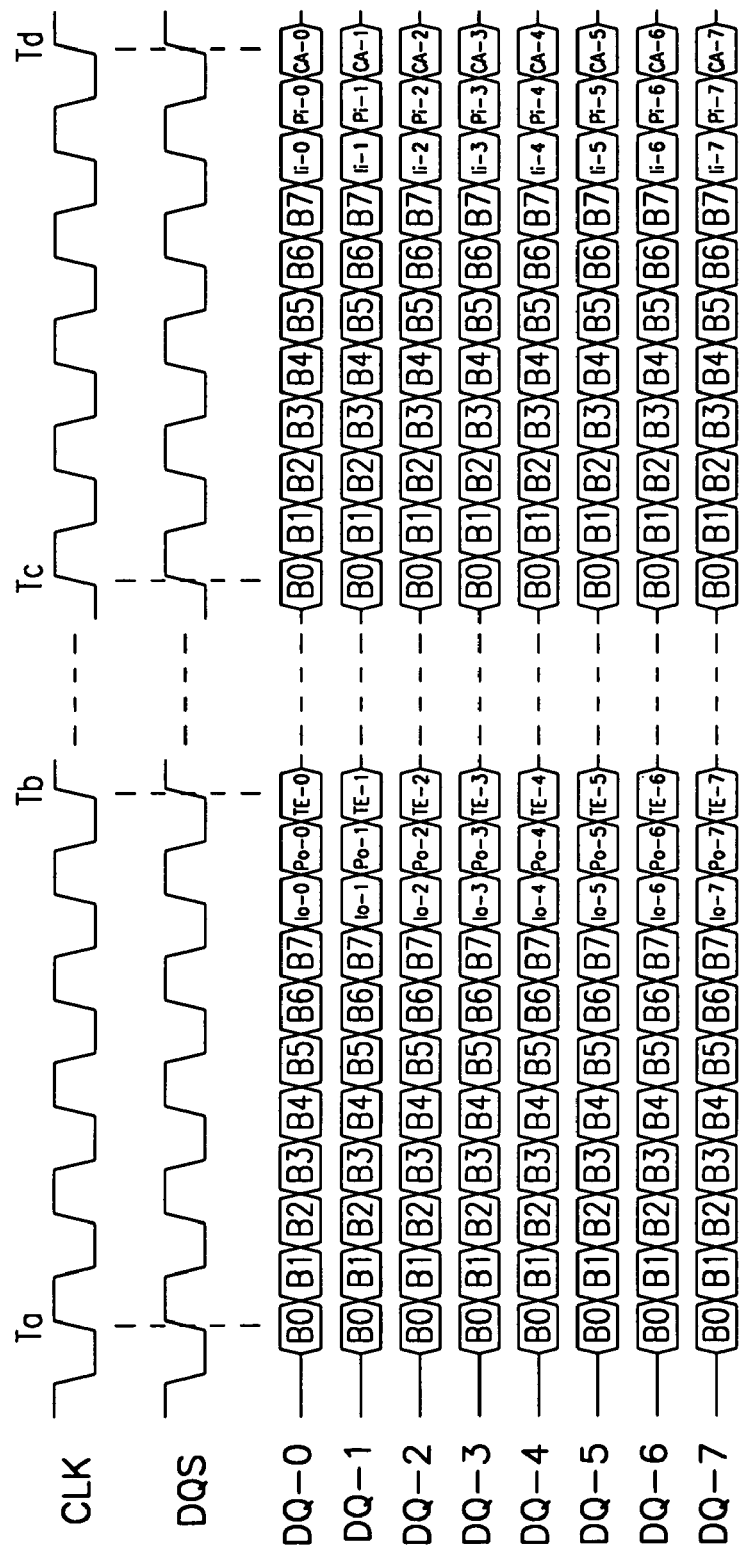
FIG. 4 is an exemplary timing diagram for auxiliary circuit of FIG. 3.

FIG. 4 is an exemplary timing diagram for the auxiliary circuit of FIG. 3. In FIG. 4, between times Ta-Tb, output data bits and output auxiliary bits are transferred. The output and input data bits are presented by bits B0, and bits B1 through bits B7. The output auxiliary bits include output inverting codes Io-0 through Io-7, output parity codes Po-0 through Po-7, and temperature codes TE-0 through TE-7. Between times Tc-Td, input data bits and input auxiliary bits are transferred. The input auxiliary bits include input inverting codes Ii-0 through Ii-7, input parity codes Pi-0 through Pi-7, and calibrating codes CA-0 through CA-7.

Times Ta-Tb may occur during a read operation of memory device 100 (FIG. 1). In the read operation, the output data bits and the output auxiliary bits are transferred by memory device 100 to data lines 194. Times Tc-Td may occur during a write operation of memory device 100. In the write operation, the input data bits and the input auxiliary bits are transferred to data lines 194 by an external device such as a memory controller or a processor.

FIG. 4 shows three groups of input auxiliary bits and output auxiliary bits existed for each of the durations Ta-Tb and Tc-Td. In some embodiments, the number of groups of input auxiliary bits and output auxiliary bits may be different from three.

Figure 5:
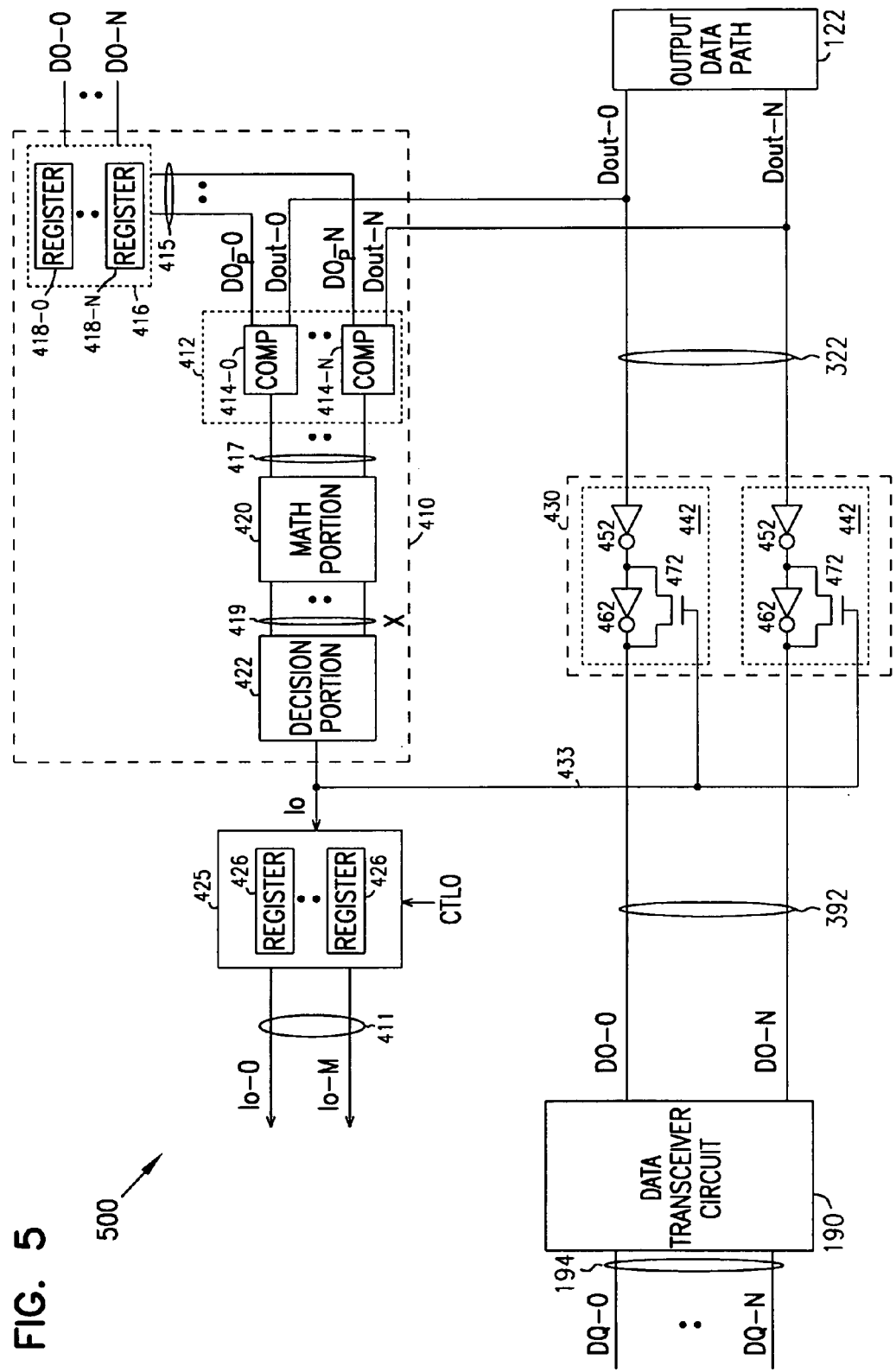
FIG. 5 is a circuit diagram of an output inversion controller according to an embodiment of the invention.

FIG. 5 is a circuit diagram of an output inversion controller according to an embodiment of the invention. Output inversion controller 500 may be used as output inversion controller 321 of FIG. 3. In FIG. 5, output inversion controller 500 includes a calculating unit 410, an output inverting code storage 425, and an output inverting unit 430. Calculating unit 410 determines whether to invert outbound data bits Dout-0 through Dout-N on lines 322 by generating an output inverting code Io for each group of data bits. For example, if there are M groups of data bits, M number of Io codes (Io-0 through Io-M) is generated. Inverting unit 430 inverts Dout-0 through Dout-N based on the Io code. Output inverting code storage 425 stores the Io code for each group of the outbound data bits Dout-0 through Dout-N. Output inverting code storage 425 includes a number of auxiliary lines 411 to carry the Io-0 through Io-M codes. Lines 411 connect to lines 392. For clarity, FIG. 4 does not show the connections between lines 411 and lines 392.

Data bits DO-0 through DO-N on lines 392 represent the data bits DQ (0-N) on data lines 194 in a read operation when data is outputted from memory device 100 (FIG. 1). For simplicity, DO-0 through DO-N are referred to as DO.

The outbound data bits Dout-0 through Dout-N on lines 322 represent data bits outputted along data path 122. DO-0 through DO-N on lines 392 are related to Dout-0 through Dout-N on lines 322. Depending on the condition of the Io code, DO-0 through DO-N may be either an inverted version or a non-inverted version (original version) of Dout-0 through Dout-N. For simplicity, Dout-0 through Dout-N are referred to as Dout.

Calculating unit 410 includes a comparing portion 412, a storage portion 416, a math portion 420, and a decision portion 422. Comparing portion 412 has a number of comparators 414 (414-0 through 414-N) for comparing Dout-0 through Dout-N on lines 322 with the previous output data bits DOp-0 through DOp-N on lines 415. DOp-0 through DOp-N are the output data bits on lines 392 from a previous output cycle. In some embodiments, each of the comparators 414 includes an exclusive OR logic for comparing the values of two corresponding output data bits.

Each of the comparators 414 compares a value of an outbound data bit (Dout) with a value of a corresponding previous output data bit (DOp). For example, comparator 414-0 compares the value of Dout-0 with the value of the DOp-0. As another example, comparator 414-N compares the value of Dout-N with the value of DOp-N. The value of the bit of data may be a logic zero (low) or a logic one (high).

After the comparison, each of the comparators 414 provides a comparison result to one of the lines 417. The comparison result may be either a logic zero or a logic one. In some embodiments, the logic zero of the comparison result indicates that the values of Dout data bits and the values of DOp data bits are the same or matched; the logic one of comparison result indicates that the values of Dout data bits and the values of DOp data bits are different or mismatched. For example, if Dout-0 and DOp-0 are the same, the comparison result on line 417-0 would be the logic zero; if Dout-0 and DOp-0 are different, the comparison result on line 417-0 would be the logic one.

Storage portion 416 includes a number of registers 418 (418-0 to 418-N) to store the values of the output data bits represented by DOp-0 through DOp-N. After each time DO appears to lines 392, storage portion 416 replaces or updates the contents of registers 418 with the value of DO. Thus, DO in the current output cycle will become DOp in the next output cycle.

Math portion 420 performs a math operation on the comparison results provided on lines 417. Math portion 420 outputs a math result on lines 419. The combination of signals (or bits) on lines 419 represents a number, indicated by X, where X is an integer. X is the number of the bits of Dout that have a different value with corresponding bits DOp. For example, if the current Dout has eight bits with bit values of 00011111 and if the previous DOp is 00011100, X would be two (2) because the last two bits of Dout and the corresponding last two bits of DO have different values. As another example, if the current Dout is 00011111 and the previous DOp is 11111111, X would be three (3) because the first three bits of Dout and the first three bits of DOp have different values.

Decision portion 422 sets the value of the Io code based on the number X on lines 419. In some embodiments, decision portion 422 sets the value of the Io code at a first value (e.g., low) when X is less than or equal to B/2 and sets the Io code at a second value (e.g., high) when X is greater than B/2. B is the number of the bits of the outbound data (Dout) which is also the number of the bits of the output data (DQ). For example, if B equals eight, the Io code is set to a first value (e.g., low) when X is less than or equal to four (B/2=4) and the Io code is set to the second value (e.g., high) when X is greater than four.

Output inverting code storage 425 includes a numbers of cells or registers 426. Each register 426 stores one output inverting code. Thus, many different inverting codes for different groups of data bits may be stored in registers 426. At a particular time, output inverting code storage 425 outputs the stored output inverting codes Io-0 through Io-M to data transceiver circuit 190 for transferring to data lines 194. For example, at a particular number of cycles of a clock signal, the CTL0 signal may be activated to output the Io-0 through Io-M codes to data transceiver circuit 190, which transfers the Io-0 through Io-M codes to data lines 194. An external device connected to memory device 100 may use the Io-0 through Io-M codes for inverting DQ-0 through DQ-N after the external device receives DQ-0 through DQ-N from memory device 100.

Output inverting unit 430 includes an input node 433 for receiving the Io code, and a number of switching devices 442. Each of the switching devices 442 is located on a path between data transceiver circuit 190 and output data path 122. Each switching device 442 includes two series-connected inverters 452 and 462 and a switch 472 connected around one of the inverters 452 and 462.

Switching devices 442 are controlled by the Io code. Switch 472 turns on when Io is at one value or state (e.g., high). When switch 472 turns on, inverter 462 is bypassed; Dout from lines 322 bypasses inverter 462 and passes through only inverter 452 and switch 472 and becomes DO at lines 392. In this case, DO is an inverted version of Dout. Switch 472 turns off when Io is at another value (e.g., low). When switch 472 turns off, inverter 462 is not bypassed; Dout from lines 322 passes through both inverters 452 and 462 becomes DO at lines 392. In this case, DO is a true version of Dout.

FIG. 6 shows exemplary data with inversion information. DOp is the previous output data bits on lines 392 (FIG. 5). Dout-0 to Dout-7 in row 1 through row 16 represent 16 different exemplary groups of current outbound data bits outputted on lines 322 from data path 122. As an example, each group of DOp and Dout has eight bits (bits 0). The "inverted Dout-0 to Dout-7" in a row is the inverted version of Dout-0 to Dout-7 in the same row. In FIG. 5, DO on lines 392 is not always an inverted version of Dout. The value of Io determines whether or not Dout is inverted such that DO is an inverted version of Dout.

In FIG. 6, DOp is 00000111. These previous bit values are used as a base to compare with each of the bit values of the 16 possible current Dout bits in row 1 through row 16.

X represents the number of differences in bit values between DOp and the corresponding eight bit values of each of the Dout-0 to Dout-7 in each row. For example, in comparing bit-to-bit among bits B0 of DOp with bits B0 of Dout in row 1, there are eight differences in the bit values. Thus, X equals eight (8) in row 1. As another example, in comparing DOp with Dout in row 6, there are three differences in the bit values. Thus, X equals three (3) in row 6.

Y represents the numbers of differences in bit values between DOp and the corresponding bit values of each of the inverted Dout-0 to Dout-7 in each row. For example, in comparing bit-to-bit among bits B0 of DOp with bits B0 of inverted Dout in row 1, there are no differences in the bit values. Thus, Y equals zero in row 1. As another example, in comparing DOp with inverted Dout in row 6, there are five differences in the bit values. Thus, Y equals five (5) in row 6.

As described in FIG. 5, X is calculated by calculating unit 410. The Io code is set based on the value of X. For example, Io is zero when X is less than or equal to B/2 and Io is one when X is greater than B/2 where B is the number of bits of DO (DOp or Dout). In FIG. 6, B=8. Thus, in row 1, Io is one (1) because X is greater than four (4). In row 6, Io is zero because X is less than four.

The value of Io indicates whether the Dout is inverted. For example, in row 1, since Io is one, Dout is inverted and the inverted version of Dout is transferred to lines 392. The inverted Dout of row 1 is 00000111. Lines 392 have the previous value DOp of 00000111, which is also equal to value of the inverted Dout 00000111. Thus, when the inverted Dout is transferred to lines 392, the value or signals on lines 392 need not to be switched or toggled because the inverted Dout and the previous DOp have the same value. In this case, since no switching (toggling) is done at lines 392, the number of switches in bit values between DOp and inverted Dout is zero (Y=0 in row 1).

In row 1, if Dout were not inverted, the number of switches at lines 392 would have been eight (X=8). Thus, in the example regarding row 1, inverting Dout before transferring Dout to lines 392 reduces the number of switches at lines 392 from eight to zero. Power is saved when the number of switches is reduced.

As another example, in row 6, since Io is zero, a non-inverted or true version of Dout is transferred to lines 392. In comparing the bits 00000000 of Dout in row 6 with the bits 00000111 of DOp, there are three bits having different value (X=3). Thus, when the true version of Dout is transferred to lines 392, bits B0 of Dout-5, Dout-6, and Dout-7 are switched. In the example regarding row 6, the number of switches in bit values between DOp and Dout is three. In row 6, if Dout were inverted and the inverted Dout in row 6 is transferred to lines 392, the number of switching would have been five (Y=5). Hence, in this case, transferring the true version of Dout includes fewer number of switches in bit values.

The examples above regarding row 1 and row 6 and the table in FIG. 6 show that depending on the value of the Io code, an inverted version or a true version of Dout is transferred. Regardless of which version of Dout is transferred, the number of switches between bit values of the data being transferred is kept at the lowest value (between X and Y), thereby improving power consumption.

Figure 7:
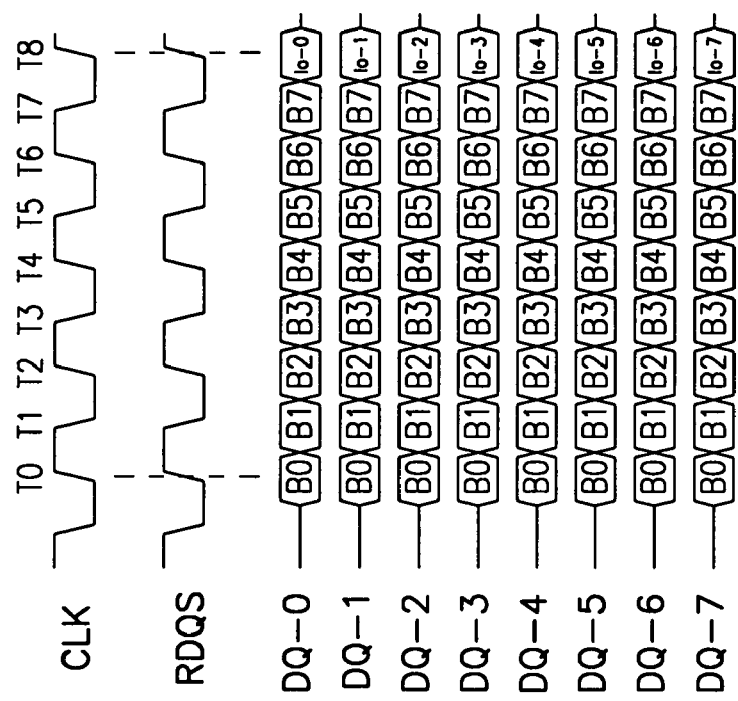
FIG. 7 is an exemplary timing diagram for the output inversion controller of FIG. 5.

FIG. 7 is an exemplary timing diagram for the output inversion controller of FIG. 5. In FIG. 7, between times T0-T7, the group of data bits DQ-0 through DQ-7 are transferred to data lines 194 (FIG. 5). At time T8, the group of output inverting codes Io-0 through Io-7 is transferred to data lines 194. Each of the Io-0 through Io-7 codes is an output inverting code for one of the groups of data bits DQ-0 through DQ-7. For example, Io-0 is the output inverting code for the group of data bits B0 of DQ-0 through DQ-7 transferred at time T0. Io-1 is the output inverting code for the group of data bits B1 of DQ-0 through DQ-7 transferred at time T1. Io-7 is the output inverting code for the group of data bits B7 of DQ-0 through DQ-7 transferred at time T7. Based on the Io-0 through Io-7 codes, the groups of data bits DQ-0 through DQ-7 are inverted accordingly.

Figure 8:
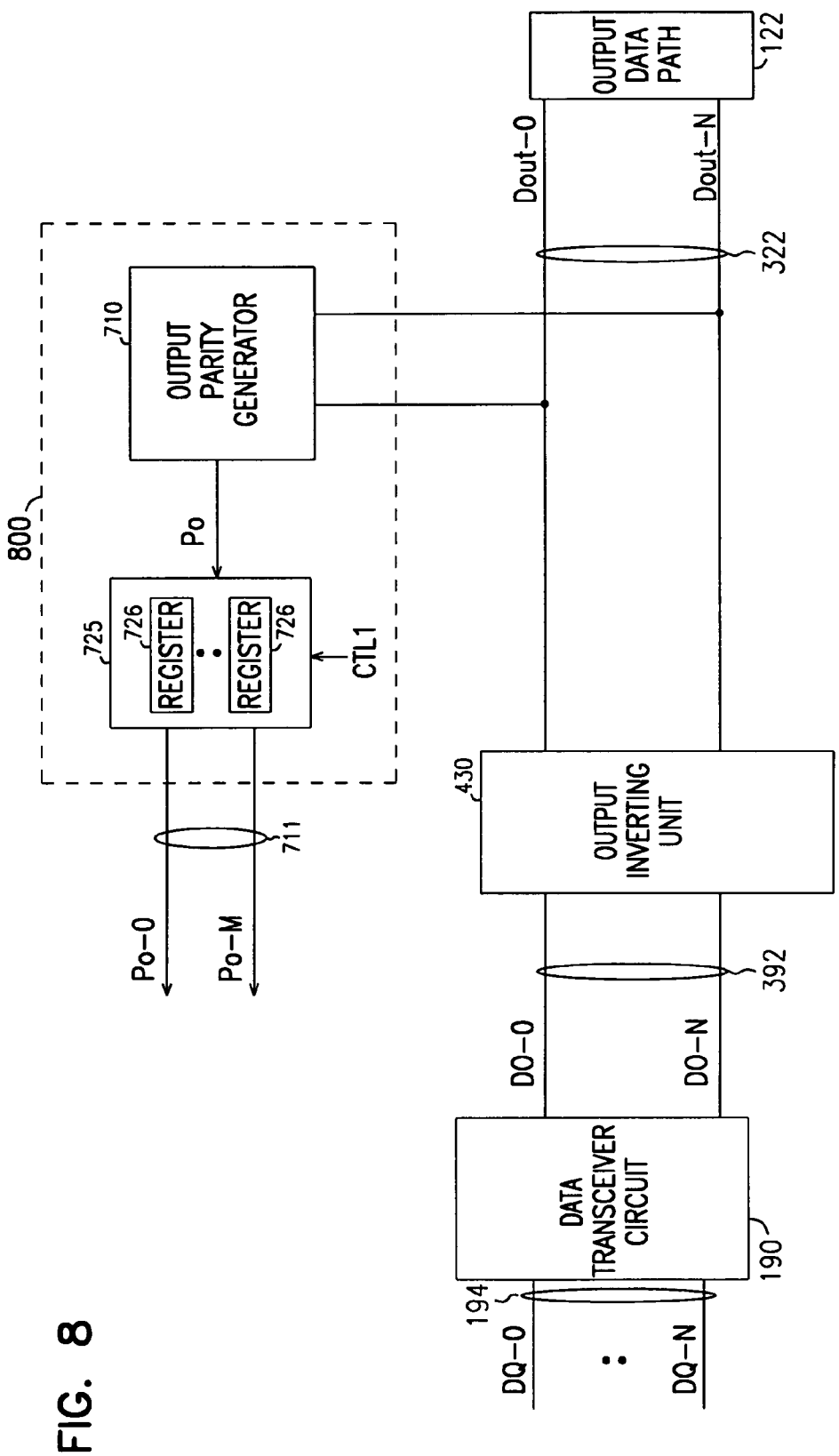
FIG. 8 is a circuit diagram of an output parity controller according to an embodiment of the invention.

FIG. 8 is a circuit diagram of an output parity controller according to an embodiment of the invention. Output parity controller 800 may be used as output parity controller 324 of FIG. 3. Output parity controller 800 includes an output parity generator 710 and an output parity code storage 725. Output parity generator 710 generates the output parity code Po based on the outbound data bits Dout-0 through Dout-N. Since Po is the parity of Dout, Po is also the parity of DO because DO is generated from Dout.

Output parity generator 710 connects to lines 322 for receiving Dout-0 through Dout-N. In some embodiments, output parity generator 710 connects to lines 392 (FIG. 3) for receiving DO. In some embodiments, output parity generator 710 includes at least one exclusive OR logic for calculating the value of Po. Output parity generator 710 provides Po to output parity code storage 725.

Output parity code storage 725 includes a numbers of cells or registers 726. Each register 726 stores one output parity code. Thus, many different parity codes for different groups of data bits can be stored in registers 726. Output parity code storage 725 includes a number of auxiliary lines 711 to carry the Po-0 through Po-M codes. Lines 111 connect to lines 392. For clarity, FIG. 7 does not show the connections between lines 111 and lines 392. At a particular time, output parity code storage 725 outputs the stored parity codes Po-0 through Po-M to data transceiver circuit 190 for transferring to data lines 194. For example, at a particular number of cycles of a clock signal, the CTL1 signal may be activated to output the Po-0 through Po-M codes to data transceiver circuit 190, which transfers the Po-0 through Po-M codes to data lines 194. An external devices connected to memory device 100 may use the Po-0 through Po-M codes for verifying DQ-0 through DQ-N after the external device receives DQ-0 through DQ-N from memory device 100.

FIG. 9 shows exemplary data with output parity information. Bits Bo represent the bits B0 of group of data bits Dout-0 through Dout-7. The parity bit Po represents the value of the output parity bit Po. Po is either zero or one. In the exemplary data of FIG. 9, Po is zero when bits B0 have an even number of zero bits (or ones bits); and Po is one when bits B0 has an odd number of zero bits (or ones bits). For example, in row 1 and row 3, Po is zero because each of the data in row 1 and row 3 has an even number of zero (or one) bits. As another example, in row 6 and row 14, Po is one because each of the data in row 6 and row 14 has an odd number of zero (or one) bits.

In the above example, Po is zero when bits B0 have an even number of zero bits (or ones bits); and Po is one when bits B0 have an odd number of zero bits (or ones bits). In some embodiments, Po is zero when bits B0 have an odd number of zero bits (or ones bits); and Po is one when bits B0 have an even number of zero bits (or ones bits).

Figure 10:
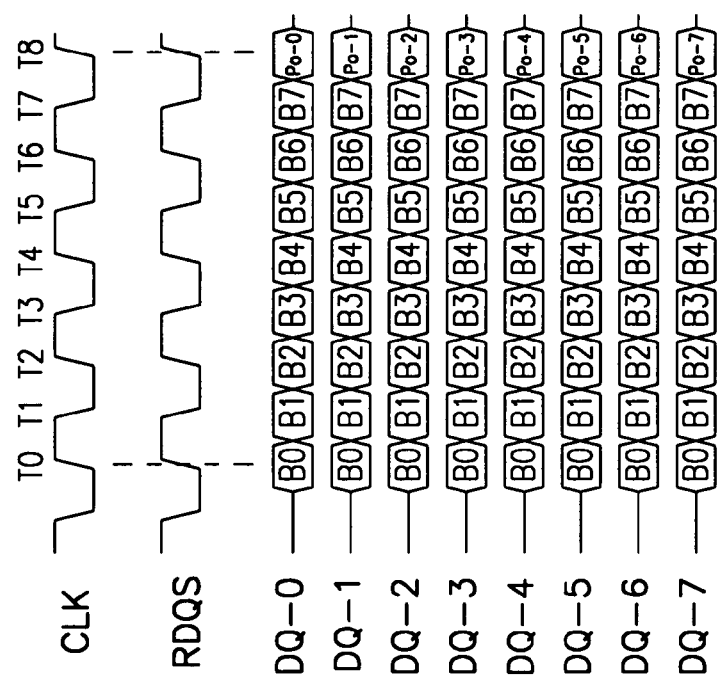
FIG. 10 is an exemplary timing diagram for the output parity controller of FIG. 8.

FIG. 10 an exemplary timing diagram for the output parity controller of FIG. 8. In FIG. 10, between times T0-T7, the group of data bits DQ-0 through DQ-7 are transferred to data lines 194 (FIG. 5). At time T8, the group of output parity codes Po-0 through Po-7 is also transferred to data lines 194. Each of the Po-0 through Po-7 codes is an output parity code for one of the groups of data bits DQ-0 through DQ-7. For example, Po-0 is the output parity code for the group of data bits B0 of DQ-0 through DQ-7 transferred at time T0. Po-1 is the output parity code for the group of data bits B1 of DQ-0 through DQ-7 transferred at time T1. Po-7 is the output parity code for the group of data bits B7 of DQ-0 through DQ-7 transferred at time T7. Based on the Po-0 through Po-7 codes, the groups of data bits DQ-0 through DQ-7 are verified accordingly.

Figure 11:
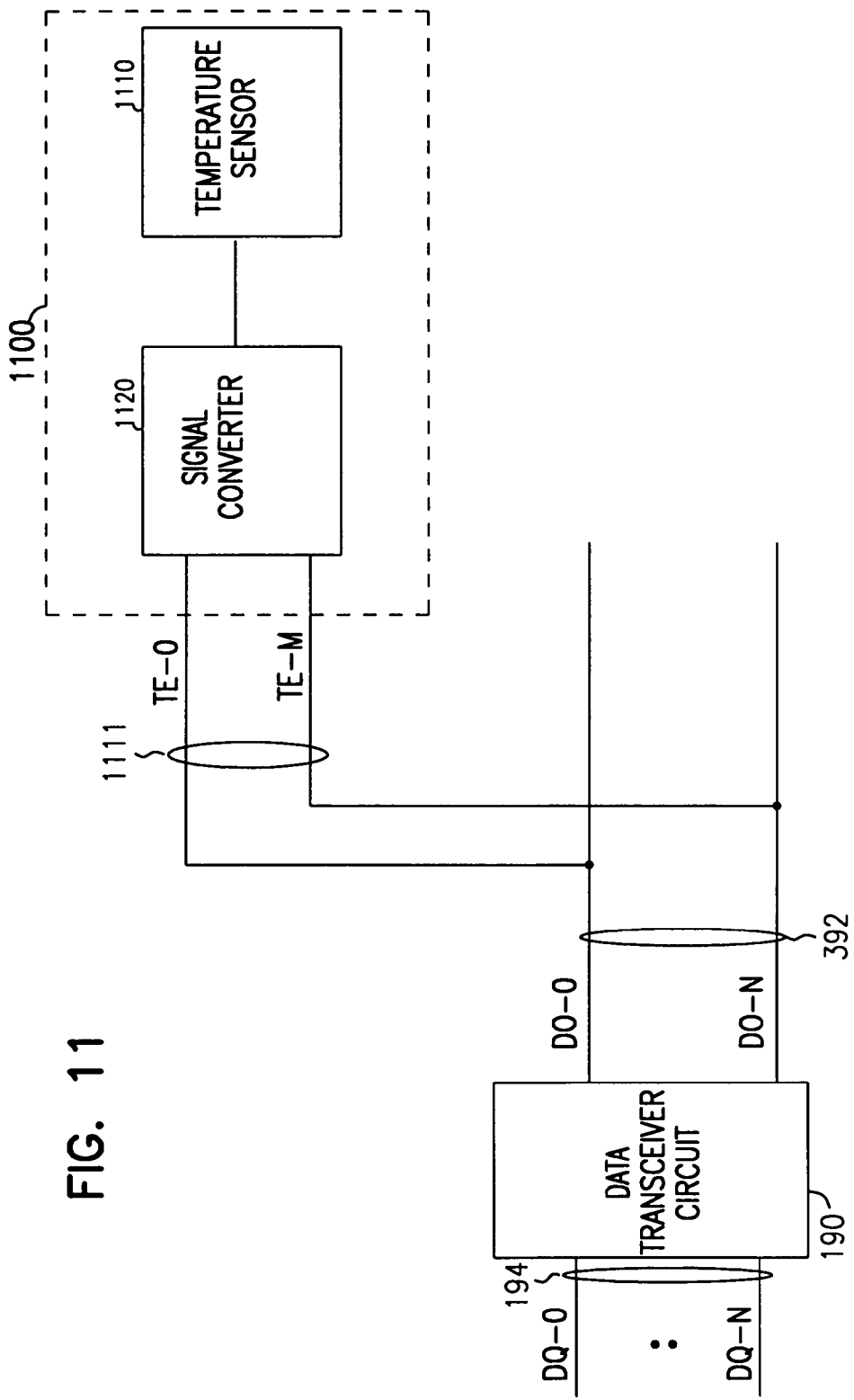
FIG. 11 is a circuit diagram of a temperature reporting circuit according to an embodiment of the invention.

FIG. 11 is a circuit diagram of a temperature reporting circuit according to an embodiment of the invention. Temperature reporting circuit 1100 may be used as temperature reporting circuit 326 of FIG. 3. In FIG. 11, temperature reporting circuit 1100 includes a temperature sensor 1110, and a signal converter 1120. Temperature sensor 1110 senses the temperature of memory device 100 (FIG. 1) and produces temperature information. In some embodiments, the temperature information is an analog temperature information. Signal converter 1120 produces a digital temperature information sensed by temperature sensor 1110. In some embodiments, signal converter 1120 includes an analog to digital converter for converting an analog temperature information into a digital temperature information. Signal converter 1120 produces the digital temperature information in a parallel format.

Signal converter 1120 includes a number of auxiliary lines 1111 to carry temperature codes TE-0 through TE-M. Signal converter 1120 outputs the TE-0 through TE-M codes to data transceiver circuit 190 for transferring to data lines 194. The combination of the TE-0 through TE-M codes represents the temperature of memory device 100. For example, if TE-0 through TE-M have eight bits (M=7), each of the 256 ($2^8$) combinations represents one of 256 possible temperatures of memory device 100.

In some embodiments, an external device connected memory device 100 receives the TE-0 through TE-M codes to control a refresh rate of memory device 100. The refresh rate is the rate at which refresh controller 160 (FIG. 1) refreshes memory cells 103. Examples of the external device include memory controllers and processors. In some embodiments, the external device may provide refresh control signals to memory device 100 based on the TE-0 through TE-M codes. Memory device 100 uses the refresh control signals to control the refresh rate. For example, at some temperature such as at a temperature lower than a normal operating temperature of memory device 100, refresh controller 160 may reduce the activation of the REFRESH (FIG. 1) signal to reduce the refresh rate to save power.

FIG. 12 shows exemplary temperature information. Bits TE-0 through TE-7 represent the temperature codes TE-0 through TE-M of FIG. 11. FIG. 12 shows eight bits of temperature codes (M=7) as an example. In some embodiments, the number of bits of the temperature codes may be different from eight.

Each combination of the TE-0 through TE-7 bits represents a different temperature. FIG. 12 shows eight different combinations of TE-0 through TE-7 (COL 1 to COL 8) representing eight different temperatures (bottom row). For example, in COL 2, TE-0 through TE-7 has the combination 00000001 representing 15 degrees Celsius. As another example, in COL 8, TE-0 through TE-7 has the combination 01111111 representing 105 degrees Celsius. Since eight bits of the TE-0 through TE-7 codes have 256 combinations, 256 different temperatures may be represented by the TE-0 through TE-7 codes. FIG. 12 shows eight combinations (eight columns) of TE-0 through TE-7 as an example, other combinations among the 256 combinations of TE-0 through TE-7 can be used to represent other temperatures different from the temperatures shown in FIG. 12.

Figure 13:
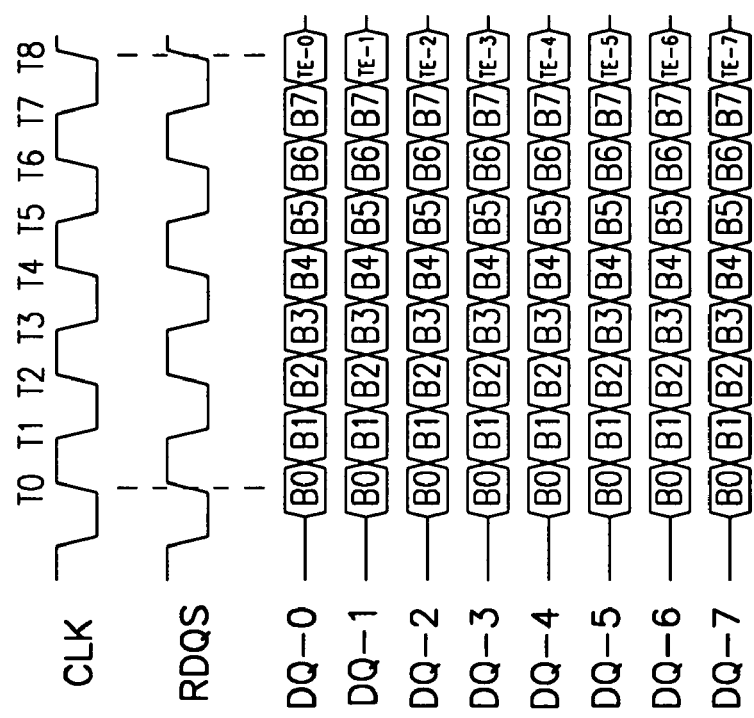
FIG. 13 is an exemplary timing diagram for the temperature reporting circuit of FIG. 10.

FIG. 13 is an exemplary timing diagram for the temperature reporting circuit of FIG. 11. In FIG. 13, between times T0-T7, the group of data bits DQ-0 through DQ-7 are transferred to data lines 194 (FIG. 11). At time T8, the group of output temperature codes TE-0 through TE-7 is transferred to data lines 194. The combination of the TE-0 through TE-7 codes represents a temperature of memory device 100 (FIG. 1). For examples the combination of the TE-0 through TE-7 codes may be 00111111 (column 7 of FIG. 12), which represent a temperature of 90 degrees Celsius.

Figure 14:
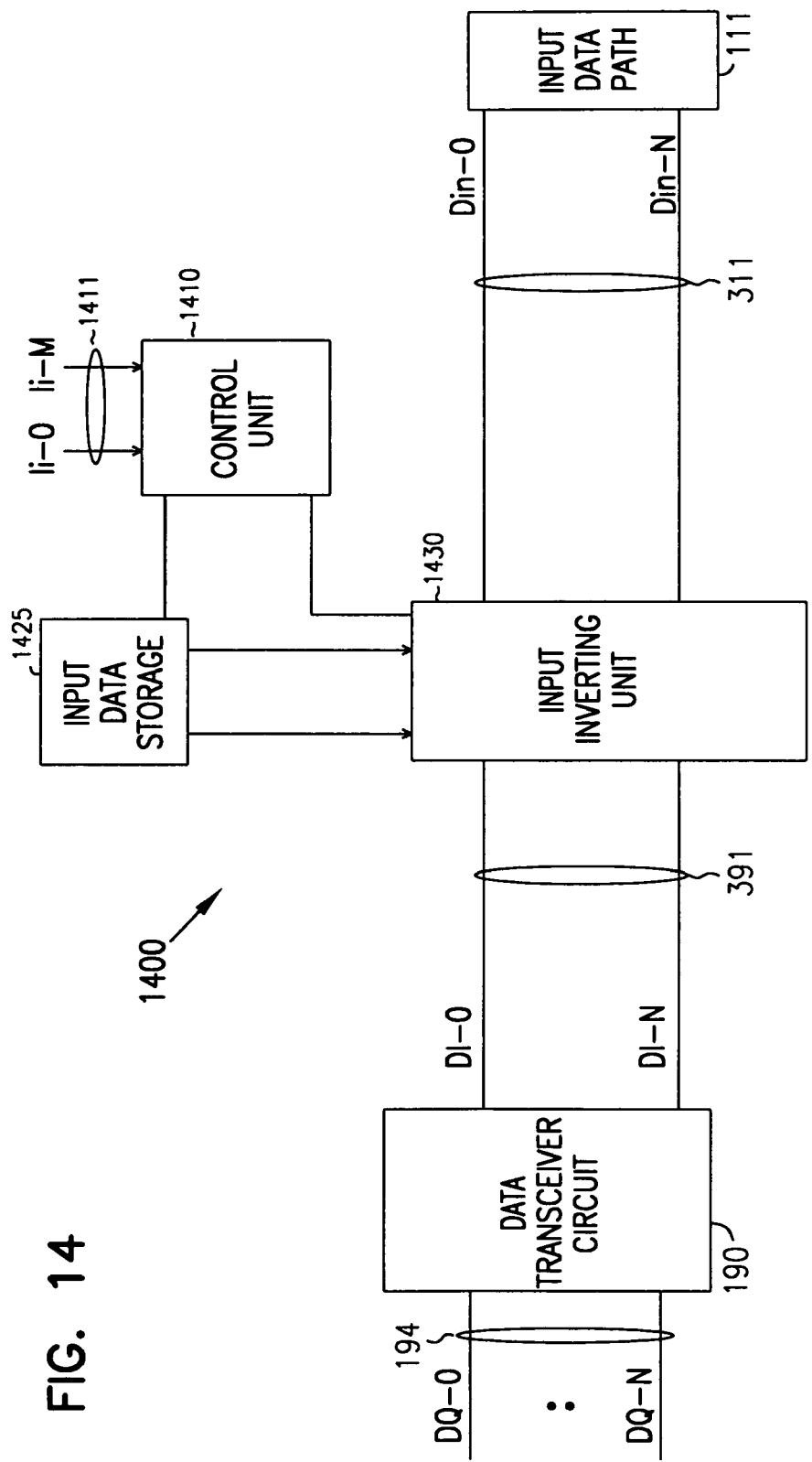
FIG. 14 is a circuit diagram of an input inversion controller according to an embodiment of the invention.

FIG. 14 is a circuit diagram of an input inversion controller according to an embodiment of the invention. Input inversion controller 1400 may be used as input inversion controller 312 of FIG. 3. In FIG. 14, data bits DI-0 through DI-N on lines 391 represent the input data bits DQ (0-N) in a write operation when data is inputted to memory device 100 (FIG. 1). For simplicity, DI-0 through DI-N are referred to as DI.

Inbound data signals or inbound data Din-0 through Din-N on lines 311 represent data inputted to input data path 111. Din-0 through Din-N are related to DI-0 through DI-N. Din-0 through Din-N may be either an inverted version or a true version of DI-0 through DI-N. For simplicity, Din-0 through Din-N are referred to as Din.

Input inversion controller 1400 includes a control unit 1410, an input data storage 1425, and an input inverting unit 1430. Input data storage 1425 stores a number of groups of data bits DI-0 through DI-N provided from lines 391 during a write cycle. The number of groups of data bits DI-0 through DI-N have corresponding input inverting codes Ii-0 through Ii-M. Each input inverting code carries inversion information of a corresponding group of data bits. Ii-0 through Ii-M are provided to input inversion controller 1400 on auxiliary lines 1411, which connect to lines 391. For clarity, FIG. 14 does not show the connections between lines 1411 and lines 391. Control unit 1410 enables input inverting unit 1430 whether or not to invert the each group of data bits stored in input data storage 1425 based on the Ii-0 through Ii-M codes. Input inverting unit 1430 provides either the inverted or the true version of the groups of data bits DI-0 through DI-N to input data path 111.

Figure 15:
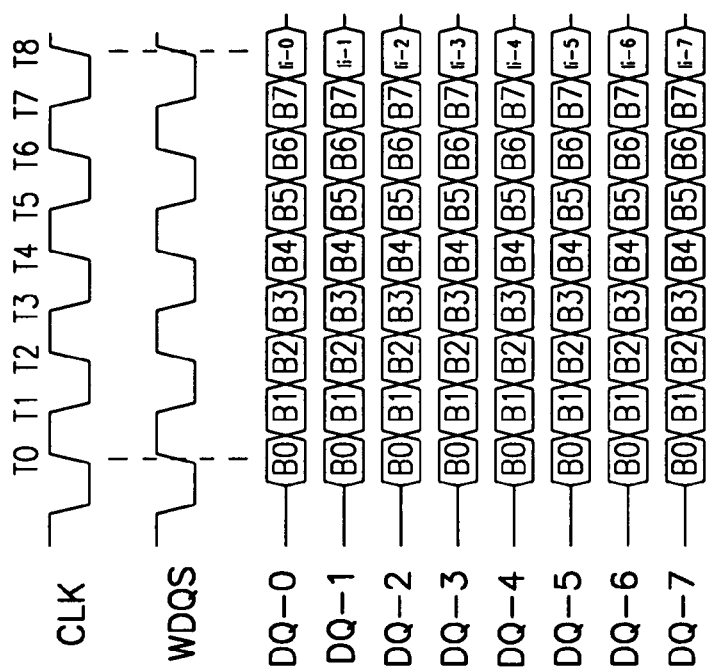
FIG. 15 is an exemplary timing diagram for the input inversion controller of FIG. 14.

FIG. 15 is an exemplary timing diagram for the input inversion controller of FIG. 14. In FIG. 15, between times T0-T7, the group of data bits DQ-0 through DQ-7 are transferred from data lines 194 (FIG. 14). At time T8, the group of input inverting codes Ii-0 through Ii-7 is transferred from data lines 194. Each of the Ii-0 through Ii-7 codes is an input inverting code for one of the groups of data bits DQ-0 through DQ-7. For example, Ii-0 is the input inverting code for the group of data bits B0 of DQ-0 through DQ-7 transferred at time T0. Ii-1 is the input inverting code for the group of data bits B1 of DQ-0 through DQ-7 transferred at time T1. Ii-7 is the input inverting code for the group of data bits B7 of DQ-0 through DQ-7 transferred at time T7. Based on the Ii-0 through Ii-7 codes, the groups of data bits DQ-0 through DQ-7 are inverted accordingly.

Figure 16:
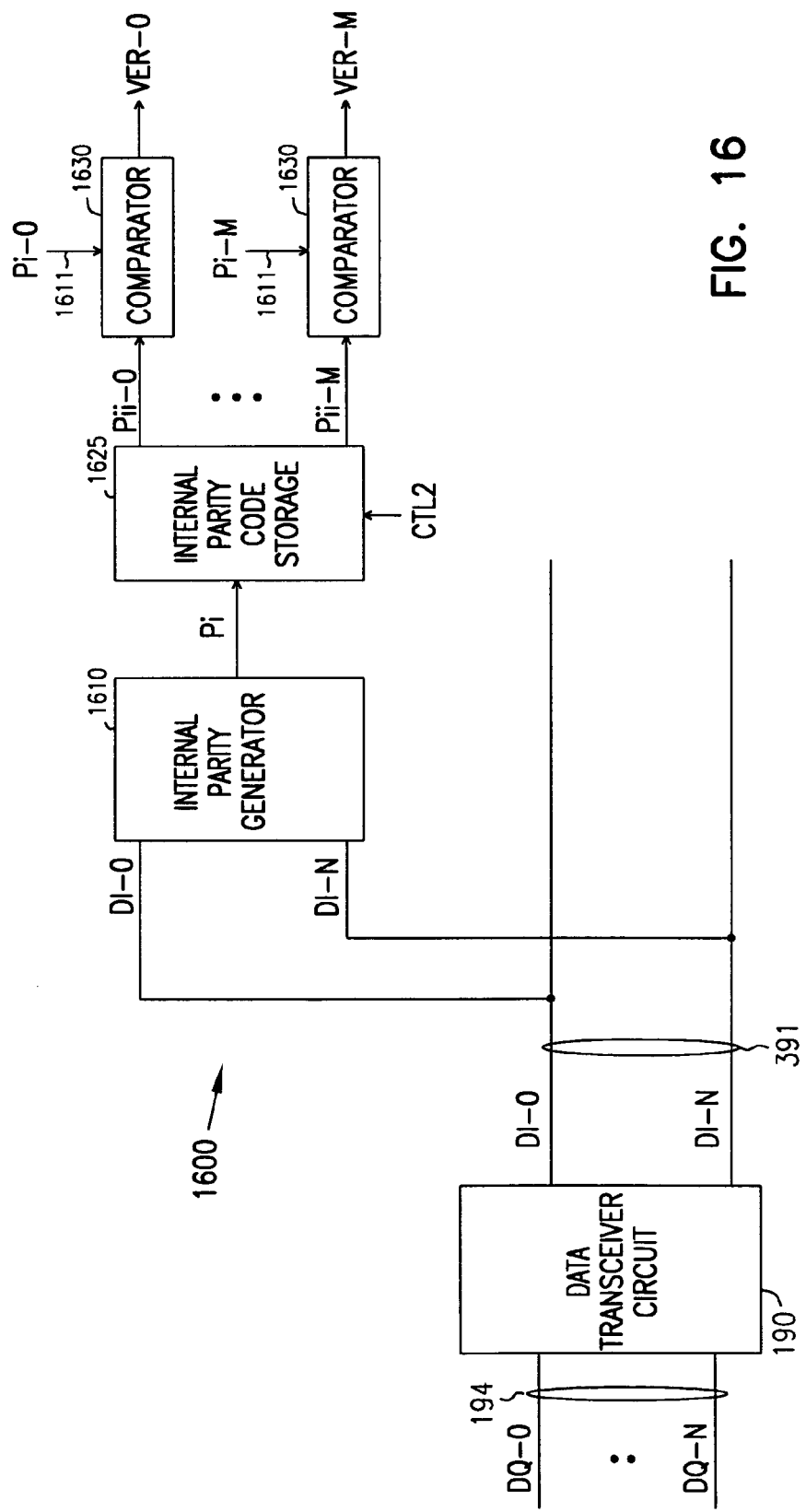
FIG. 16 is a circuit diagram of an input parity controller according to an embodiment of the invention.

FIG. 16 is a circuit diagram of an input parity controller according to an embodiment of the invention. Input parity controller 1600 may be used as output parity controller 324 of FIG. 3. Input parity controller 800 includes an internal parity generator 1610, an internal parity storage 1625, and a number of comparators 1630. Internal parity generator 1610 generates an internal parity code Pii for each group of input data bits DI-0 through DI-N. For example, if there are M groups of data bits, M number of Pi codes (Pii-0 through Pii-M) is generated. In some embodiments, internal parity generator 1610 includes at least one exclusive OR logic for calculating the parity of each group of input data bits DI-0 through DI-N. Internal parity generator 1610 provides the internal parity codes to internal parity storage 1625.

Comparators 1630 receives a number of input parity codes Pi-0 through Pi-M from auxiliary lines 1611, which connect to lines 391. For clarity, FIG. 16 does not show the connections between lines 1611 and lines 391. At a particular time, input parity storage 1625 provides the stored internal parity codes to comparators 1630. For example, at a particular number of cycles of a clock signal, the CTL2 signal may be activated to output the Pi-0 through Pi-M codes to comparators 1630. Comparators 1630 compare the stored Pii-0 through Pii-M with Pi-0 through Pi-M and output verification signals VER-0 through VER-M. The states of the VER-0 through VER-M signals determine the validity of the groups of input data bits DI-0 through DI-N.

Figure 17:
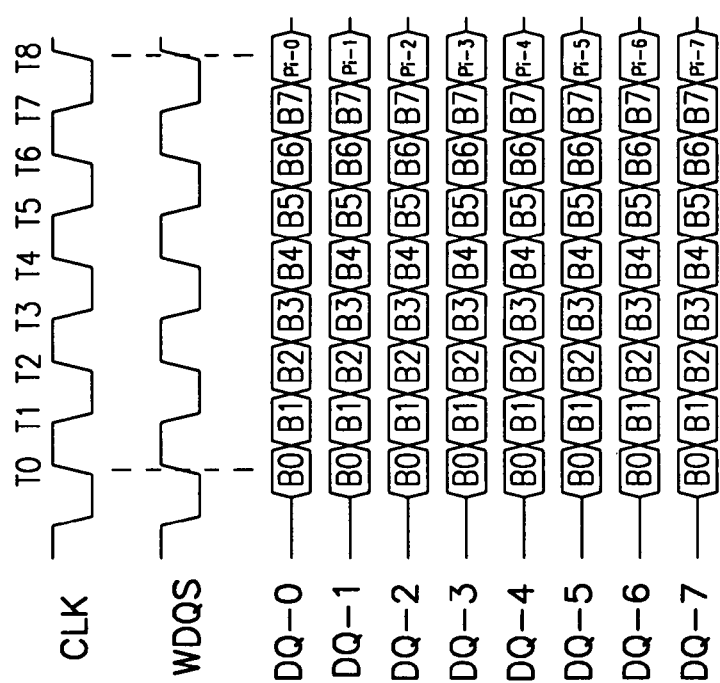
FIG. 17 is an exemplary timing diagram for the input parity controller of FIG. 16.

FIG. 17 is an exemplary timing diagram for the input parity controller of FIG. 16. In FIG. 17, between times T0-T7, the group of data bits DQ-0 through DQ-7 are transferred from data lines 194 (FIG. 16). At time T8, the group of input parity codes Pi-0 through Pi-7 is transferred from data lines 194. Each of the Pi-0 through Pi-7 codes is an input parity code for one of the groups of data bits DQ-0 through DQ-7. For example, Pi-0 is the input parity code for the group of data bits B0 of DQ-0 through DQ-7 transferred at time T0. Pi-1 is the input parity code for the group of data bits B1 of DQ-0 through DQ-7 transferred at time T1. Pi-7 is the input parity code for the group of data bits B7 of DQ-0 through DQ-7 transferred at time T7. Based on the Pi-0 through Pi-7 codes, the groups of data bits DQ-0 through DQ-7 are verified accordingly.

Figure 18:
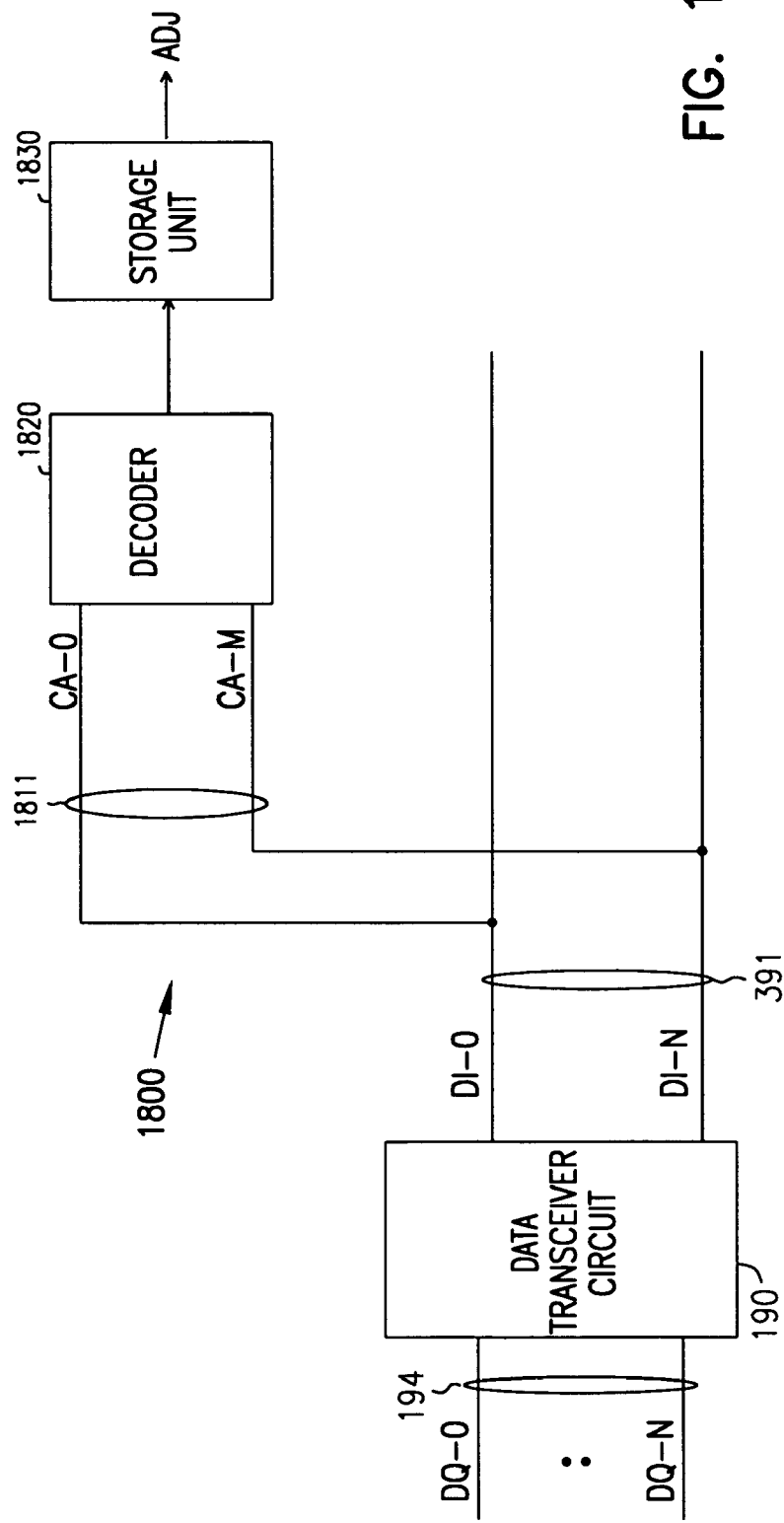
FIG. 18 is a circuit diagram of a calibrating circuit according to an embodiment of the invention.

FIG. 18 is a circuit diagram of a calibrating circuit according to an embodiment of the invention. Calibrating circuit 1800 may be used as calibrating circuit 316 of FIG. 3. In FIG. 18, calibrating circuit 1800 receives a number of timing calibrating codes CA-0 through CA-M. A combination of the CA-0 through CA-M codes on auxiliary lines 1811 represents a timing delay. In some embodiments, the CA-0 through CA-M codes is provided to memory device 100 (FIG. 1) by an external device such as a memory controller or a processor.

Calibrating circuit 1800 includes a decoder 1820 and a storage unit 1830. Decoder 1820 decodes the CA-0 through CA-M code to provide calibrating information representing the timing delay. Storage unit 1830 stores the timing delay provided by decoder 1820. Based on the timing delay, storage unit 1830 sends an adjust signal ADJ to control circuit 118 (FIG. 1). In some embodiments, the ADJ signal has multiple bits and the combination of the multiple bits corresponds to the timing delay stored in storage unit 1830. Based on the ADJ signal, a control circuit such as control circuit 118 adjusts the timing of the transfer of data from data transceiver circuit 190 to data lines 194.

In some embodiments, the external device (e.g., memory controller or processor) sends the CA-0 through CA-M codes memory device 100 during a calibrating process or an initialization process. In the calibrating process, the external device may send different groups of the CA-0 through CA-M codes to memory device 100. In response to the CA-0 through CA-M codes, memory device 100 may transfer multiple output data in multiple data transfers to the external device at different times. Each time, each of the multiple output data has different timing delay corresponding to each group of the CA-0 through CA-M codes. The external device may detect the most accurate data transfer among the multiple data transfers by memory device 100. In some embodiments, after the most accurate data transfer is detected, the external device sends memory device 100 a final group of the CA-0 through CA-M codes representing a timing delay corresponding to the most accurate data. Storage unit 1830 stores the final group of the CA-0 through CA-M codes. Control circuit 118 adjusts the timing of data transceivers 192 such that after the calibrating process, subsequent data transferred from memory device 100 to the external device are more accurate.

FIG. 19 shows exemplary calibrating timing information. CA-0 through CA-7 represent the timing calibrating codes CA-0 through CA-M of FIG. 18. FIG. 19 shows eight bits of the calibrating codes (M=7) as an example. In some embodiments, the number of bits of the timing calibrating codes may be different from eight.

Each combination of the CA-0 through CA-7 codes represents a different timing delay. FIG. 19 shows eight different combinations of the CA-0 through CA-7 codes (COL 1 to COL 8) representing eight different timing delays (bottom row). For example, in COL 2, the CA-0 through CA-7 codes have the combination 00000001, which represents a time delay of 150 picoseconds. As another example, in COL 8, the CA-0 through CA-7 codes have the combination 01111111, which represents a time delay of 200 picoseconds. Since eight bits of the CA-0 through CA-7 codes have 256 combinations, 256 different time delays may be represented by the CA-0 through CA-7 codes. FIG. 19 shows eight combinations (eight columns) of CA-0 through CA-7 codes as an example, other combinations among the 256 combinations of the CA-0 through CA-7 codes can be used to represent other values for the time delay different from the values shown in FIG. 19.

Figure 20:
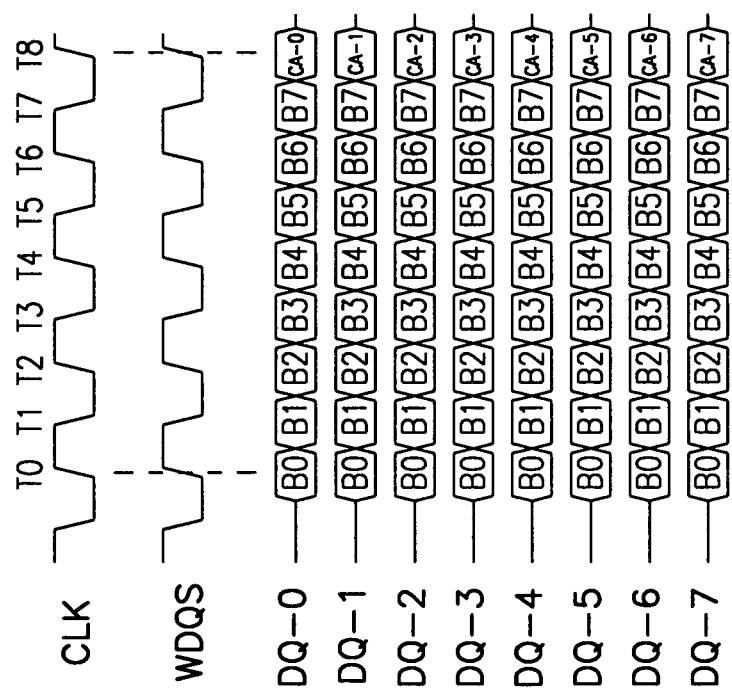
FIG. 20 shows an exemplary calibrating timing information for the calibrating circuit of FIG. 18.

FIG. 20 is an exemplary timing diagram for the calibrating circuit of FIG. 18

In FIG. 20, between times T0-T7, the group of data bits DQ-0 through DQ-7 are transferred from data lines 194 (FIG. 18). At time T8, the group of timing calibrating codes CA-0 through CA-7 is transferred from data lines 194. The combination of the CA-0 through CA-7 codes represents a time delay. For examples the combination of the CA-0 through CA-7 codes may be 00001111 (column 5 of FIG. 19), which represent a time delay of 50 picoseconds.

Figure 21:
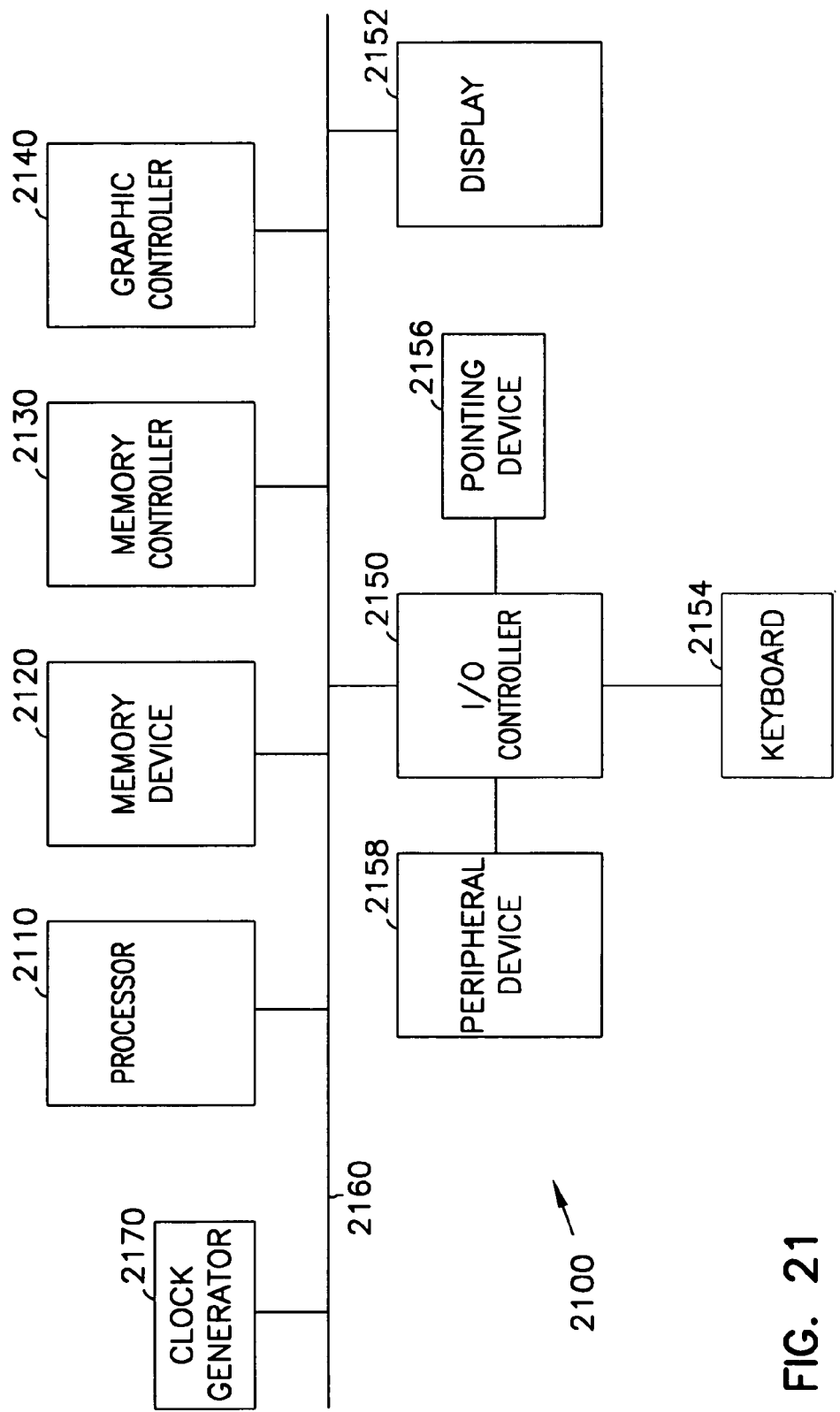
FIG. 21 shows a system according to an embodiment of the invention.

FIG. 21 shows a system according to an embodiment of the invention. System 2100 includes a processor 2110, a memory device 2140, a memory controller 2130, a graphic controller 2140, and an input and output (I/O) controller 2150, a display 2152, a keyboard 2154, a pointing device 2156, and a peripheral device 2158. A bus 2160 couples all of these devices together. A clock generator 2170 provides a clock signal to at least one of the devices of system 2100 via bus 2160. An example of clock generator 2170 includes an oscillator in a circuit board such as a motherboard. Two or more devices shown in system 2100 may be formed in a single chip.

Memory device 2140 may be memory device 100 (FIG. 1). Further, at least one of the devices shown in system 2100 includes an auxiliary circuit such as auxiliary circuit 195 (FIG. 1) for receiving input auxiliary information, generating output auxiliary information, and performing functions on input and output data transferred between memory device 2140 and other devices in system 2100.

Bus 2160 may be interconnect traces on a circuit board or may be one or more cables. Bus 2160 may also couple the devices of system 2100 by wireless means such as by electromagnetic radiations, for example, radio waves. Peripheral device 2158 may be a printer, an optical device such as CD-ROM and DVD reader and writer, a magnetic device reader and writer such as a floppy disk driver, or an audio device such as a microphone.

System 2100 represented by FIG. 21 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Conclusion

Various embodiments of the invention provide circuits and methods for transferring data and auxiliary information to and from a memory device using the same lines.

Some embodiments of the invention include a memory device having a plurality of data lines, a memory array for storing data, a transceiver circuit, and an auxiliary circuit having auxiliary lines for carrying auxiliary information. The transceiver circuit connects to the memory array and the data lines for transferring the data between the memory array and the data lines. The transceiver circuit also connects to the auxiliary circuit for transferring the auxiliary information between the auxiliary lines and the data lines.

Other embodiments of the invention include a method of transferring data in a memory device. The method transfers a number of groups of data bits on a plurality of data lines, the data bits having a first type of data. The method also transfers a plurality of auxiliary bits on the data lines, the auxiliary bits having a second type of data. The method further performs a first function on bits of each of the groups of data bits and performs a second function on the auxiliary bits.

It is to be understood that the above description is intended to be illustrative, and not restrictive. Many other embodiments will be apparent to those of skill in the art upon reading and understanding the present application including the drawings and the claims. Although specific embodiments are described herein, those skilled in the art recognize that other embodiments may be substituted for the specific embodiments shown to achieve the same purpose. This application covers any adaptations or variations of the present invention. Therefore, the embodiments of the present invention are limited only by the claims and all available equivalents.

What is claimed is:

1. A method comprising:

transferring a number of groups of data bits on a plurality of data lines, the data bits having a first type of data;

transferring a plurality of auxiliary bits on the data lines, the auxiliary bits having a second type of data, wherein transferring the groups of data bits includes serially transferring at least one data bit of the group of data bits on a selected data line of the data lines and transferring at least one of the auxiliary bits on the selected data line;
performing a first function on bits of each of the groups of data bits; and
performing a second function on the auxiliary bits.

2. A method comprising:
transferring a number of groups of data bits on a plurality of data lines, the data bits having a first type of data;
transferring a plurality of auxiliary bits on the data lines, the auxiliary bits having a second type of data, wherein transferring the number of groups of data bits includes transferring at least one of the data bits on a selected data line of the data lines at a first time and transferring at least one of the auxiliary bits on the selected data line at a second time;
performing a first function on bits of each of the groups of data bits; and
performing a second function on the auxiliary bits.

3. A method comprising:
transferring a number of groups of data bits on a plurality of data lines, the data bits having a first type of data;
transferring a plurality of auxiliary bits on the data lines, the auxiliary bits having a second type of data, wherein the auxiliary bits represent a plurality of inverting codes for the groups of data bits;
performing a first function on bits of each of the groups of data bits; and
performing a second function on the auxiliary bits.

4. The method of claim 1, wherein the auxiliary bits represent a plurality of parity codes the groups of data bits.

5. The method of claim 1, wherein the auxiliary bits represent a temperature information.

6. The method of claim 1, wherein the auxiliary bits represent time delay information.

7. The method of claim 1, wherein the first function is conditionally inverting bits of the groups of data bits.

8. The method of claim 1, wherein the first function is comparing bits within each of the groups of data bits.

9. The method of claim 1, wherein the second function is decoding the auxiliary bits to generate a temperature information.

10. The method of claim 1, wherein the second function is decoding the auxiliary bits to generate a time delay information.

11. The method of claim 1, wherein transferring the groups of data bits occurs before transferring the auxiliary bits.

12. The method of claim 1, wherein the number of groups of data bits is a multiple of two.

13. A method comprising:
transferring a number of groups of data bits between a memory array and a plurality of data lines;
transferring a number of groups of auxiliary bits on the data lines, wherein at least one of the groups of auxiliary bits represents auxiliary information of the groups of data bits, wherein transferring the number of groups of data bits includes transferring at least one data bit of the groups of data bits on a selected data line of the data lines at a first time and transferring at least one of the auxiliary bits on the selected data line at a second time;
performing a first function on bits of each of the groups of data bits; and
performing a second function on bits of each of the groups of auxiliary bits.

14. A method comprising:
transferring a number of groups of data bits between a memory array and a plurality of data lines;
transferring a number of groups of auxiliary bits on the data lines, wherein at least one of the groups of auxiliary bits represents auxiliary information of the groups of data bits, wherein transferring the number of groups of data bits includes serially transferring at least one group of the data bits on a selected data line of the data lines and transferring at least one of the auxiliary bits on the selected data line;
performing a first function on bits of each of the groups of data bits; and
performing a second function on bits of each of the groups of auxiliary bits.

15. A method comprising:
transferring a number of groups of data bits between a memory array and a plurality of data lines;
transferring a number of groups of auxiliary bits on the data lines, wherein at least one of the groups of auxiliary bits represents auxiliary information of the groups of data bits, wherein each bit of a first group of auxiliary bits represents an inverting code for one of the groups of data bits;
performing a first function on bits of each of the groups of data bits; and
performing a second function on bits of each of the groups of auxiliary bits.

16. The method of claim 15, wherein each bit of a second group of auxiliary bits represents a parity code for one of the groups of data bits.

17. The method of claim 16, wherein a combination of bits of a third group of auxiliary bits represents a temperature information.

18. The method of claim 17, wherein a combination of bits of a fourth group of auxiliary bits represents a time delay information.

19. A method comprising:
transferring a number of groups of data bits between a memory array and a plurality of data lines
transferring a number of groups of auxiliary bits on the data lines, wherein at least one of the groups of auxiliary bits represents auxiliary information of the groups of data bits, wherein performing the first function includes conditionally inverting the bits of each of the groups of data bits;
performing a first function on bits of each of the groups of data bits; and
performing a second function on bits of each of the groups of auxiliary bits.

20. The method of claim 19, wherein performing the first function includes comparing bits of each of the groups to generate a parity code for each of the groups of data bits.

21. The method of claim 20, wherein performing the second function includes decoding a combination of a first group of auxiliary bits to generate a temperature information.

22. The method of claim 21, wherein performing the second function includes decoding a combination of bits of a second group of auxiliary bits to adjust a propagation delay of data transferred on the plurality of data lines.

23. The method of claim 13, wherein at least one of the groups of auxiliary bits is transferred before the transferring of the number of groups of data bits.

24. A method comprising:
transferring a number of groups of data bits on a plurality of data lines, the data bits having a first type of data; and
transferring a plurality of auxiliary bits on the data lines, the auxiliary bits having a second type of data, wherein at least one of the auxiliary bits and at least one of the data bits is transferred on a same selected data line of the data lines.

25. The method of claim 24, wherein the auxiliary bits include a plurality of inverting codes for the groups of data bits.

26. The method of claim 24, wherein the auxiliary bits include a plurality of parity codes the groups of data bits.

27. The method of claim 24, wherein the auxiliary bits include a temperature information.

28. The method of claim 24, wherein the auxiliary bits include time delay information.

* * * * *

UNITED STATES PATENT AND TRADEMARK OFFICE
CERTIFICATE OF CORRECTION

PATENT NO. : 7,417,901 B2  Page 1 of 1
APPLICATION NO. : 11/382649
DATED : August 26, 2008
INVENTOR(S) : Choi It is certified that error appears in the above-identified patent and that said Letters Patent is hereby corrected as shown below:

In column 15, line 30, in Claim 4, after "codes" insert -- for --.

In column 16, line 38, in Claim 19, after "lines" insert -- ; --.

In column 17, line 8, in Claim 26, after "codes" insert -- for --.

Signed and Sealed this

Eleventh Day of November, 2008

JON W. DUDAS
*Director of the United States Patent and Trademark Office*